United States Patent
Boyd

(10) Patent No.: US 6,836,054 B2
(45) Date of Patent: Dec. 28, 2004

(54) THICKNESS MODE PIEZOELECTRIC TRANSDUCER WITH RESONANT DRIVE CIRCUIT

(75) Inventor: Clark D. Boyd, Radford, VA (US)

(73) Assignee: Face International Corp., Norfolk, VA (US)

(*) Notice: Subject to any disclaimer, the term of this patent is extended or adjusted under 35 U.S.C. 154(b) by 0 days.

(21) Appl. No.: 09/951,326

(22) Filed: Sep. 11, 2001

(65) Prior Publication Data

US 2003/0048037 A1 Mar. 13, 2003

(51) Int. Cl.[7] .................................................. H01L 41/08
(52) U.S. Cl. ................................. 310/316.01; 310/325
(58) Field of Search ....................... 310/316.01, 316.02, 310/319, 325

(56) References Cited

U.S. PATENT DOCUMENTS

| | | | | |
|---|---|---|---|---|
| 3,218,488 A | * | 11/1965 | Jacke ........................... | 310/325 |
| 3,813,616 A | * | 5/1974 | AntoneVich ............ | 310/316.01 |
| 3,889,166 A | * | 6/1975 | Scurlock ................. | 310/316.01 |
| 3,924,335 A | * | 12/1975 | Balamuth et al. ... | 310/316.01 X |
| 4,325,255 A | * | 4/1982 | Howard et al. ................ | 73/589 |
| 4,469,974 A | * | 9/1984 | Speranza ................ | 310/316.01 |
| 5,376,858 A | * | 12/1994 | Imabayashi et al. .... | 310/325 X |

* cited by examiner

Primary Examiner—Mark Budd
(74) Attorney, Agent, or Firm—David J. BolDuc; Stephen E. Clark

(57) ABSTRACT

A thickness mode piezoelectric transducer is provided that has masses attached to opposing faces of the transformer. The end-masses increase the thickness of the transformer and decrease its resonant frequency. The end-masses increase the magnitude of resonant vibrations in the output layer(s) as well as the mechanical Q of the device to provide a low profile piezoelectric transformer with high power density. Each of the input and output portions is resonant tank circuit having a electrical resonant frequency substantially matching the mechanical resonance whereby the amplitude of the mechanical vibrations are increased. These mechanical vibrations are used in conjunction with a mechanical amplifier or horn for use of the device as a vibrational transducer.

15 Claims, 11 Drawing Sheets

THICKNESS MODE PIEZOELECTRIC TRANSDUCER WITH RESONANT DRIVE CIRCUIT

BACKGROUND OF INVENTION

1. Field of Invention

The present invention relates to a multilayer piezoelectric transformer using thickness mode resonant vibration for step-up voltage conversion applications. A metallic mass is bonded to the output ceramic layer(s) thereby providing a piezoelectric transformer operating at a lower frequency, with higher gain and power density than a piezoelectric transformer using simply a thick output ceramic layer. A drive circuit provides a sinusoidal input while an inductor connected across the output layer increases the amplitude of the electrical and mechanical resonance whereby the transformer generates sufficient motion to be used as an actuator.

2. Description of the Prior Art

Wire wound-type electromagnetic transformers have been used for generating high voltage in internal power circuits of devices such as televisions or fluorescent lamp ballasts. Such electromagnetic transformers take the form of a conductor wound onto a core made of a magnetic substance. Because a large number of turns of the conductor are required to realize a high transformation ratio, electromagnetic transformers that are effective, yet at the same time compact and slim in shape are extremely difficult to produce. Furthermore, in view of high frequency applications, the electromagnetic transformer has many disadvantages involving magnetic material of the electromagnetic transformer, such as sharp increase in hysteresis loss, eddy-current loss and conductor skin-effect loss. Those losses limit the practical frequency range of magnetic transformers to not above 500 kHz.

To remedy this and many other problems of the wire-wound transformer, piezoelectric ceramic transformers (or PTs) utilizing the piezoelectric effect have been provided in the prior art. In contrast to electromagnetic transformers, PTs have a sharp frequency characteristic of the output voltage to input voltage ratio, which has a peak at the resonant frequency. This resonant frequency depends on the material constants and thickness of materials of construction of the transformer including the piezoelectric ceramics and electrodes. Furthermore PTs have a number of advantages over general electromagnetic transformers. The size of PTs can be made much smaller than electromagnetic transformers of comparable transformation ratio, PTs can be made nonflammable, and produce no electromagnetically induced noise.

The ceramic body employed in PTs takes various forms and configurations, including rings, flat slabs and the like. Typical examples of a prior PTs are illustrated in FIGS. 1 and 2. This type of PT is commonly referred to as a "Rosen-type" piezoelectric transformer. The basic Rosen-type piezoelectric transformer was disclosed in U.S. Pat. No. 2,830,274 and numerous variations of this basic apparatus are well known in the prior art. The typical Rosen-type PT comprises a flat ceramic slab 20 appreciably longer than it is wide and substantially wider than it is thick. In the case of FIG. 1, the piezoelectric body 20, is in the form of a flat slab that is considerably wider than it is thick, and having greater length than width. In the case of FIG. 2, the piezoelectric body is in the form of a disk polarized in the thickness direction in its central portion and polarized radially about the remaining annular portion.

As shown in FIG. 1, a piezoelectric body 20 is employed having some portions polarized differently from others. A substantial portion of the slab 20, the generator portion 22 to the right of the center of the slab is polarized longitudinally, and has a high impedance in the direction of polarization. The remainder of the slab, the vibrator portion 21 is polarized transversely to the plane of the face of the slab (in the thickness direction) and has a low impedance in the direction of polarization. In this case the vibrator portion 21 of the slab is actually divided into two portions. The first portion 24 of the vibrator portion 21 is polarized transversely in one direction, and the second portion 26 of the vibrator portion 21 is also polarized transversely but in the direction opposite to that of the polarization in the first portion 24 of the vibrator portion 21.

In order that electrical voltages may be related to mechanical stress in the slab 20, electrodes are provided. If desired, there may be a common electrode 28, shown as grounded. For the primary connection and for relating voltages at opposite faces of the low impedance vibrator portion 21 of the slab 20, there is an electrode 30 opposite the common electrode 28. For relating voltages to stresses generated in the longitudinal direction in the high impedance generator portion 22 of the slab 20, there is a secondary or high-voltage electrode 35 on the end of the slab for cooperating with the common electrode 28. The electrode 35 is shown as connected to a terminal 34 of an output load 36 grounded at its opposite end.

In the arrangement illustrated in FIG. 1, a voltage applied between the electrodes 28 and 30 of the low impedance vibrator portion 21 is stepped up to a higher voltage between the electrodes 28 and 35 in the high impedance generator portion for supplying the load 36 at a much higher voltage than that applied between the electrodes 28 and 30. The applied voltage causes a deformation of the slab through proportionate changes in the x-y and y-z surface areas. More specifically, the Rosen PT is operated by applying alternating voltage to the drive electrodes 28 and 30, respectively. A longitudinal vibration is thereby excited in the low impedance vibrator portion 21 in the transverse effect mode ("d31 mode"). The transverse effect mode vibration in the low impedance vibrator portion 21 in turn excites a vibration in the high impedance generator portion 22 in a longitudinal effect longitudinal vibration mode ("g33 mode"). As the result, high voltage output is obtained between electrode 28 and 35. On the other hand, for obtaining output of step-down voltage, as appreciated, the high impedance portion 22 undergoing longitudinal effect mode may be used as the input and the low impedance portion 21 subjected to transverse effect mode vibration as the output.

The Rosen type PT has been found disadvantageous in that the only useable coupling coefficient is k31, which is associated with the very small transverse effect longitudinal vibration mode ("d31 mode"). This results in obtaining only a very small bandwidth. Conventional piezoelectric transformers like this operate only up to about 200 kHz.

Another inherent problem of such prior PTs is that they have relatively low power transmission capacity. This disadvantage of prior PTs relates to the fact that little or no mechanical advantage is realized between the vibrator portion 21 of the device and the driver portion 22 of the device, since each is intrinsically a portion of the same electroactive member. This inherently restricts the mechanical energy transmission capability of the device, which, in turn, inherently restricts the electrical power handling capacity of such devices.

Additionally, even under resonant conditions, because the piezoelectric voltage transmission function of Rosen-type PTs is accomplished by proportionate changes in the x-y and y-z surface areas (or, in certain embodiments, changes in the x-y and x'-y' surface areas) of the piezoelectric member, which changes are of relatively low magnitude, the power handling capacity of prior circuits using such piezoelectric transformers is inherently low.

In addition, with the typical Rosen transformer, it is generally necessary to alternately apply positive and negative voltages across opposing faces of the vibrator portion 21 of the member in order to "push" and "pull", respectively, the member into the desired shape.

Even under resonant conditions, prior electrical circuits that incorporate such prior PTs are relatively inefficient, because the energy required during the first half-cycle of operation to "push" the piezoelectric member into a first shape is largely lost (i.e. by generating heat) during the "pull" half-cycle of operation. This heat generation corresponds to a lowering of efficiency of the circuit, an increased fire hazard, and/or a reduction in component and circuit reliability.

Furthermore, in order to reduce the temperature of such heat generating circuits, the circuit components (typically including switching transistors and other components, as well as the transformer itself) are oversized, which reduces the number of applications in which the circuit can be utilized, and which also increases the cost/price of the circuit.

Because the power transmission capacity of such prior PTs is so low, it has become common in the prior art to combine several such transformers together into a multi-layer "stack" in order to achieve a greater power transmission capacity than would be achievable using one such prior transformer alone. This, of course, increases both the size and the manufacturing cost of the transformer.

Also generally known are PTs polarized and vibrating in the thickness direction (i.e., vibrations are parallel to the direction of polarization of the layers). Illustrative of such "thickness mode" vibration PTs is the device of U.S. Pat. No. 5,118,982 to Inoue shown in FIGS. 3 and 4. A thickness mode vibration PT typically comprises a low impedance portion 11 and a high impedance portion 12 stacked on each other. The low impedance portion 11 and the high impedance portion 12 of the thickness mode PT typically comprises a series of laminate layers of ceramic alternating with electrode layers. Each portion is composed of at least two electrode layers and at least one piezoelectric material layer. Each of the piezoelectric ceramic layers of the low impedance portion 11 and the ceramic layer of the high impedance portion 12 are polarized in the thickness direction (perpendicular to the plane of the interface between the ceramic layers). Every alternate electrode layer in each portion 11 or 12 may be connected to each other and to selected external terminals.

The thickness mode PT of FIG. 3 comprises a low impedance vibrator portion 11 including a plurality of piezoelectric layers 111 through 114 and a high impedance vibrator portion 12 including a piezoelectric layer 122, each of the layers being integrally laminated, as shown in FIG. 4, and caused to vibrate in thickness-extensional mode.

The low impedance portion 11 has a laminated structure which comprises multi-layered piezoelectric layers 111 through 114, all of the same thickness, each being interposed between electrodes including the top surface electrode layer 201 and internal electrode layers 131 through 134. The high impedance portion 12 is constructed of the bottom electrode layer. 202, an internal electrode layer 134 and a single piezoelectric layer 122 interposed between both electrode layers 202 and 134. The thickness of the high impedance portion 12 must be an integer multiple of the thickness of one of the input layers 111–114. Polarization in each piezoelectric layer is, as indicated by arrows, in the direction of thickness, respectively. In the low impedance portion 11, alternating piezoelectric layers are polarized in opposite directions to each other. The polarization in the high impedance portion 12 is also in the direction of thickness.

The three-terminal construction of FIG. 3 has a common electrode 134 to which one terminal 16 of each portion is connected. A four-terminal construction as in FIG. 4 includes a pair of terminals 16 and 17 for the low impedance portion 11 and another pair of terminals 18 and 19 for the high impedance portion 12. The total thickness of the PT of FIG. 3 or 4 can be equal to a half wavelength (lambda/2) or one full wavelength (lambda) of the drive frequency.

When an alternating voltage is applied to the electrode layers across the ceramic layer of the vibrator portion 11, a vibration is excited in the ceramic parallel to the direction of the polarization of the layers in the longitudinal vibration mode ("d33 mode"). This vibration of the low impedance portion 11 excites a vibration in the high impedance portion 12. As the high impedance portion 12 vibrates, the g33 mode deformation of the high impedance portion 12 generates an electrical voltage across the electrodes of the high impedance portion 12. When operating the PT in the thickness-extensional mode with a resonance of lambda/2 mode or lambda mode the PT may operate in a frequency range of 1–10 MHz, depending on the PT's thickness.

A problem with prior thickness mode PTs is that the thickness mode resonant frequency is too high for some applications. Since dielectric losses are proportional to frequency, this high frequency causes high losses.

Another problem with prior thickness mode PTs is that they do not have a sufficient power transmission capacity for some applications.

Another problem with prior thickness mode PTs is that the addition of ceramic layers to the PT does not significantly raise the power density of such devices and may increase capacitive and dielectric losses.

Another problem with prior thickness mode PTs is that they do not have a sufficient amplitude of motion at resonance to act simultaneously as an actuator.

Accordingly, it would be desirable to provide a piezoelectric transformer design that has a higher power transmission capacity than similarly sized prior piezoelectric transformers.

It would also be desirable to provide a piezoelectric transformer that is smaller than prior piezoelectric transformers that have similar power transmission capacities.

It would also be desirable to provide a piezoelectric transformer in which the "driver" portion of the device and the "driven" portion of the device are not the same electroactive element.

It would also be desirable to provide a piezoelectric transformer that develops a substantial mechanical advantage between the driver portion of the device and the driven portion of the device.

It would also be desirable to provide a piezoelectric transformer that, at its natural frequency, oscillates with greater momentum than is achievable with comparably sized prior piezoelectric transformers.

It would also be desirable to provide a piezoelectric transformer that does not generate as much heat as prior devices, and therefore has decreased loss due to the heat.

It would also be desirable to provide a piezoelectric transformer in which the heat that is generated is dissipated quickly, and therefore has decreased loss due to the heat.

It would also be desirable to provide a piezoelectric transformer having sufficient motion at resonance to be used as an actuator.

It would also be desirable to provide a drive circuit that drives a piezoelectric transformer/actuator at a high amplitude mechanical resonance.

SUMMARY OF THE INVENTION

According to the present invention, there is provided a Thickness Mode Piezoelectric Transformer (TMPT) preferably operating at its natural (i.e. "resonant") frequency to convert a transformer input signal of a first character (i.e. voltage, frequency and current) to a transformer output signal of a second character (i.e. voltage, frequency and current). The disclosed TMPT efficiently accomplishes the described signal conversion by subjecting the input "driver" section of the TMPT to an alternating voltage which causes the input portion to deform and vibrate, which in turn causes the output portion(s) to vibrate, which in turn causes the "driven" output portion of the TMPT to deform, and which in turn generates an output voltage at the driven section of the transformer.

The outermost portions of the output section have end-masses attached to them. These end-masses are added to the output portion of the PT and may replace one or more layers of ceramic in the output portion and thereby serve to increase the momentum of movement of the output portions. The end-masses reduce the resonant frequency of the TMPT and increase the gain of the TMPT by increasing the power density in the output ceramic layers. The end-masses may be metallic and further serve as output terminals and heat sink devices. One end-mass may be configured as a resonant horn to amplify the vibrations of the TMPT for use in a vibrational transducer.

The preferred embodiment of the invention provides a multi-layer piezoelectric transformer/transducer capable of achieving high mechanical momentum (arid, therefore, is capable of high energy storage and transmission). The multi-layer piezoelectric transformer/transducer is driven by a circuit in a manner that achieves sufficient movement of the end-masses of the to act as a vibrational actuator.

Accordingly, it is an object the present invention to provide a TMPT design that has a higher power transmission capacity than similarly sized prior PTs.

It is another object of the present invention to provide a TMPT that is smaller than prior PTs that have similar power transmission capacities.

It is another object of the present invention to provide a TMPT in which the "driver" portion of the device and the "driven" portion of the device are not the same electroactive element.

It is another object of the present invention to provide a TMPT that develops a substantial mechanical advantage between the driver portion of the device and the driven portion of the device.

It is another object of the present invention to provide a TMPT that, at its natural frequency, oscillates with greater momentum than is achievable in comparably sized prior PTs.

It is another object of the present invention to provide a TMPT that is relatively less expensive to manufacture than prior TMPTs that perform comparable signal transformation functions.

It is another object of the present invention to provide a TMPT that vibrates with greater momentum to achieve a higher gain than prior TMPTs.

It is another object of the present invention to provide a TMPT that vibrates with a lower frequency to achieve a higher gain than prior TMPTs.

It is another object of the present invention to provide a TMPT and that is simpler to manufacture than prior TMPTs having a laminate structure.

It is another object of the present invention to provide a TMPT that has fewer losses due to capacitive and dielectric losses.

It is another object of the present invention to provide a TMPT that generates less heat than prior TMPTs, and thereby has reduced losses due to heat.

It is another object of the present invention to provide a circuit for driving a TMPT that vibrates the TMPT to achieve a higher mechanical displacement than prior TMPTs.

It is another object of the present invention to provide a circuit of the character described that achieves a mechanical displacement sufficient to act as a vibratonal actuator.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which.

DESCRIPTION OF THE PREFERRED EMBODIMENT

Figure 1:
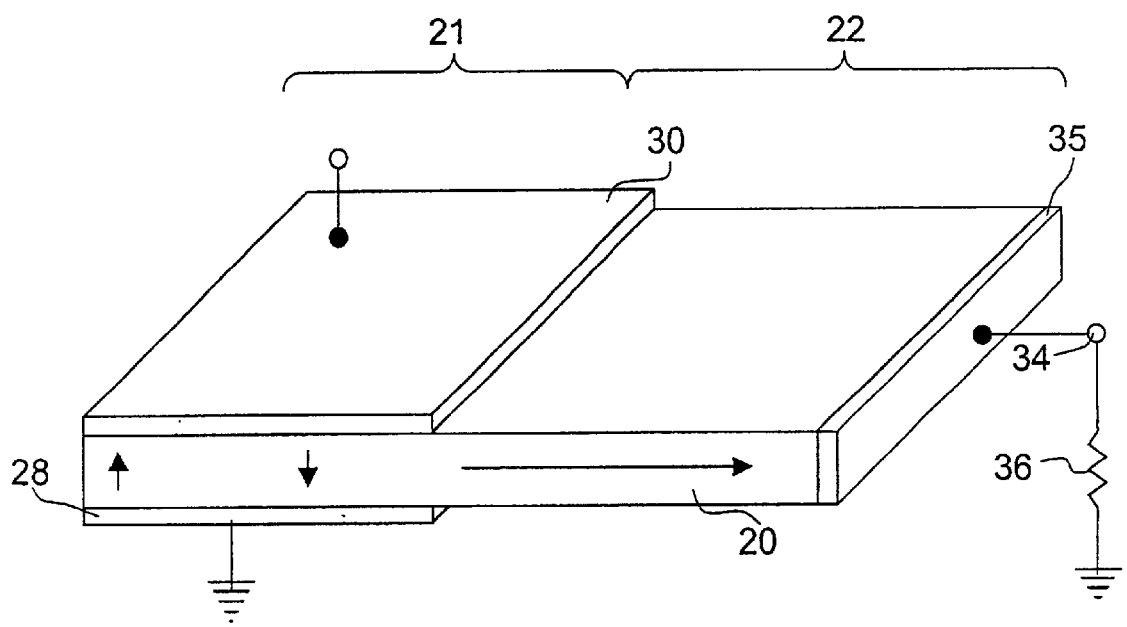
FIG. 1 is a partially schematic perspective view of a typical Rosen type piezoelectric transformer of the prior art.
Figure 2:
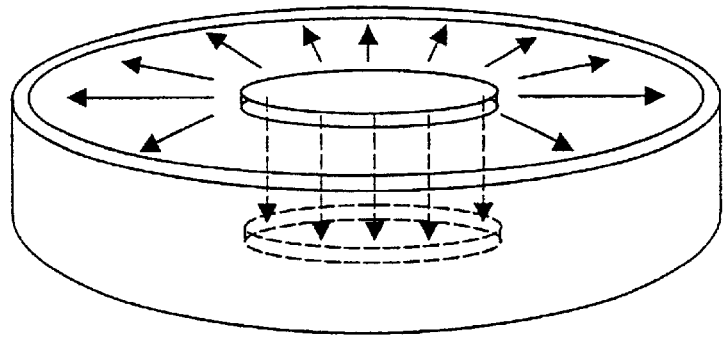
FIG. 2 is a perspective view of another example of a Rosen type piezoelectric transformer of the prior art.
Figure 3:
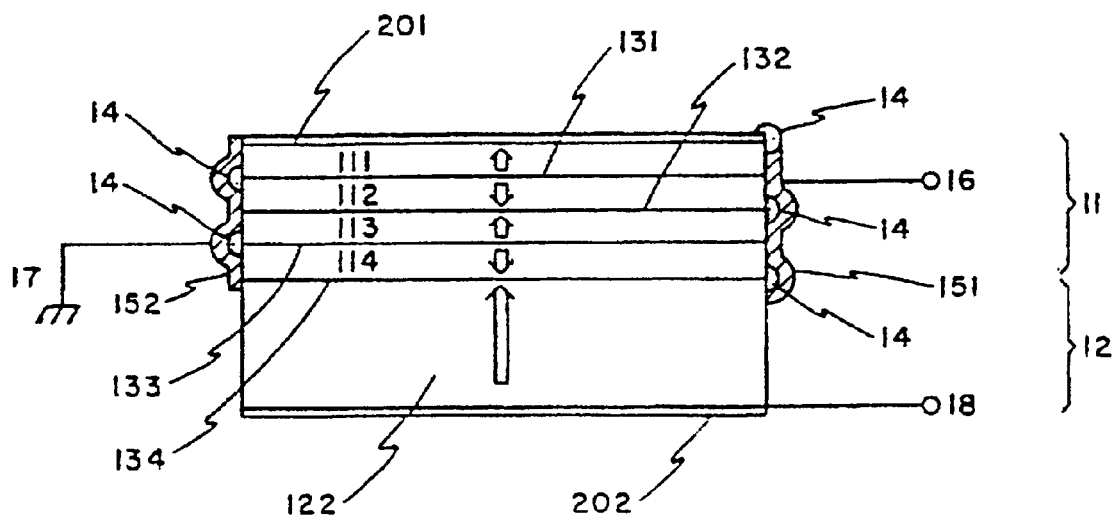
FIG. 3 is a perspective view of a typical multi-layer thickness mode vibration piezoelectric transformer of the prior art.
Figure 4:
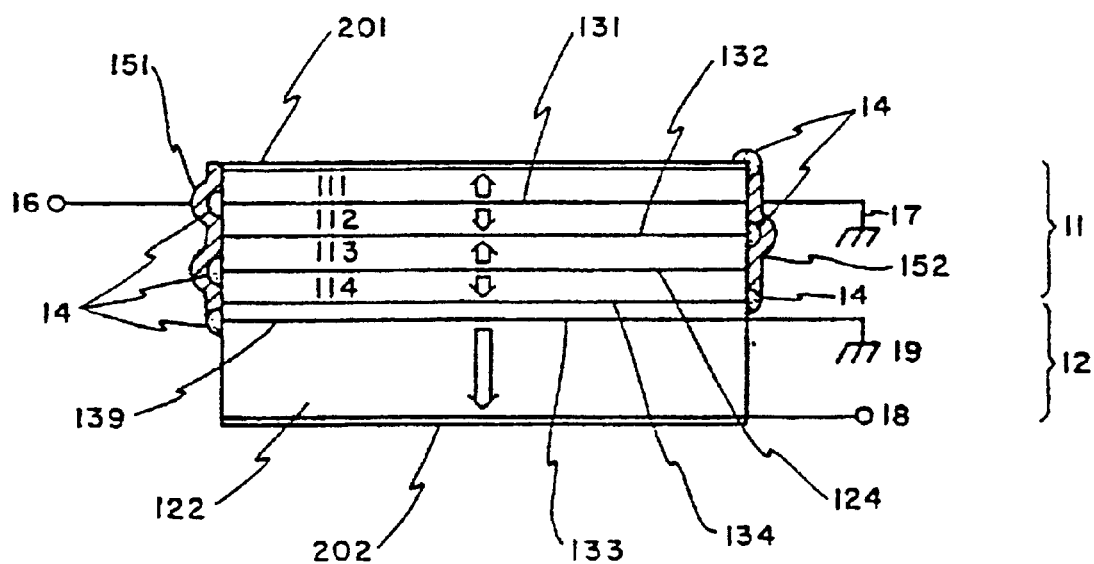
FIG. 4 is a perspective view of another multi-layer thickness mode vibration piezoelectric transformer of the prior art.

In the present invention, a multilayer piezoelectric transformer is provided using thickness mode resonant vibration for step-up voltage conversion applications. An end-mass is bonded to the output ceramic layer. This may be alternatively viewed as replacement of a portion of the output ceramic layer with an end-mass. The end-mass thereby provides a piezoelectric transformer operating at a lower frequency, with higher gain and higher power density than a piezoelectric transformer of the same size using simply a thick output ceramic layer.

Typical thickness mode piezoelectric transformers (TMPTs) utilize a multilayer construction in attempting to provide greater voltage gain and power to circuit applications. The transformation ratio is typically substantially proportional to the square of the impedance ratio of the input and output portions. There is however a practical limit to the efficacy of added ceramic layers and after a certain point, additional ceramic layers do not contribute to the gain of the TMPT. In the present invention it has been found that the addition of end-masses to the output portion(s) of a TMPT may effectively raise the gain achievable in a TMPT.

The output power P of piezoelectric transformer operating in thickness-extensional mode vibration is expressed, based on a simplified consideration from the viewpoint of energy, approximately as:

$$P \propto f_r \cdot V \cdot \epsilon_{33}^s \cdot k_t^2 \cdot P/Q_M$$

where $f_r$ is thickness-extensional mode resonance frequency, $\epsilon_{33}^s$ is constraint dielectric constant, V is volume of the piezoelectric transformer, $k_t$ is electromechanical coupling coefficient of thickness-extensional mode vibration, and $Q_M$ is the mechanical quality factor. Thus, in a TMPT the power output per unitary volume (power density) increases with greater electromechanical coupling coefficient $k_t$ and higher resonant frequency $f_r$ of piezoelectric ceramic resonator. By increasing the mechanical quality factor of the piezoelectric transformer, the power transmission efficiency can become higher. Using laminate techniques, prior TMPTs have had poor parallel precision and planeness which resulted in a low mechanical quality factor and lower power transmission efficiency.

In the present invention, a typically metal end-mass is bonded to the output portion of a TMPT. This bonding may be viewed as adding additional mass to the ends of the TMPT or as replacing some or all of the ceramic in an output portion of the TMPT. Adding an end-mass to the output portion of the TMPT increases the total mass and volume of the TMPT. An end-mass may be used to replace a portion of output ceramic and depending on the density of the end-mass that replaces the ceramic, the total volume of the TMPT can remain the same while the mass decreases (with a less dense end-mass) or increases (with the denser end-mass). Alternatively, an end-mass may be used to replace a portion of output ceramic and the total mass of the TMPT may remain the same while the volume or length of the TMPT increases (with a less dense end-mass) or decreases (with a denser end-mass). These examples are only illustrative of the effect of different density end-masses added to or-replacing a part of the output ceramic of the TMPT and it is not necessary for either the mass or volume of the TMPT to remain constant.

In the preferred embodiment of the TMPT a dense end-mass is added to the output portion of the TMPT, increasing both the mass and volume of the TMPT. An increase in the mass of the TMPT as well as a length increase lowers the resonant frequency of the TMPT while increasing the gain and power density. The increase in gain is due to the fact that the added mass increases the momentum of the device without adding any ceramic layers (which add to the capacitance and dielectric losses). The increase in gain without adding ceramic layers results in a higher power density (ratio of power to volume ceramic). Furthermore the length of the end-mass(es) may be selected to ensure that during-operation of the TMPT, maximum compressive and tensile forces are concentrated at the bond line 56 and 58 between the input and output portion(s), resulting in increased gain. Further, since the metallic end-masses have a high mechanical quality factor $Q_M$, the gain and power density increase commensurate with increased mechanical quality factor of the composite TMPT. Furthermore, the cost of the TMPT is reduced due to the availability of inexpensive metal layers to replace the more expensive ceramic layers, and the ease of bonding metal end-masses to ceramic layers as opposed to the expense of conventional laminated multilayer manufacturing techniques.

Figure 5:
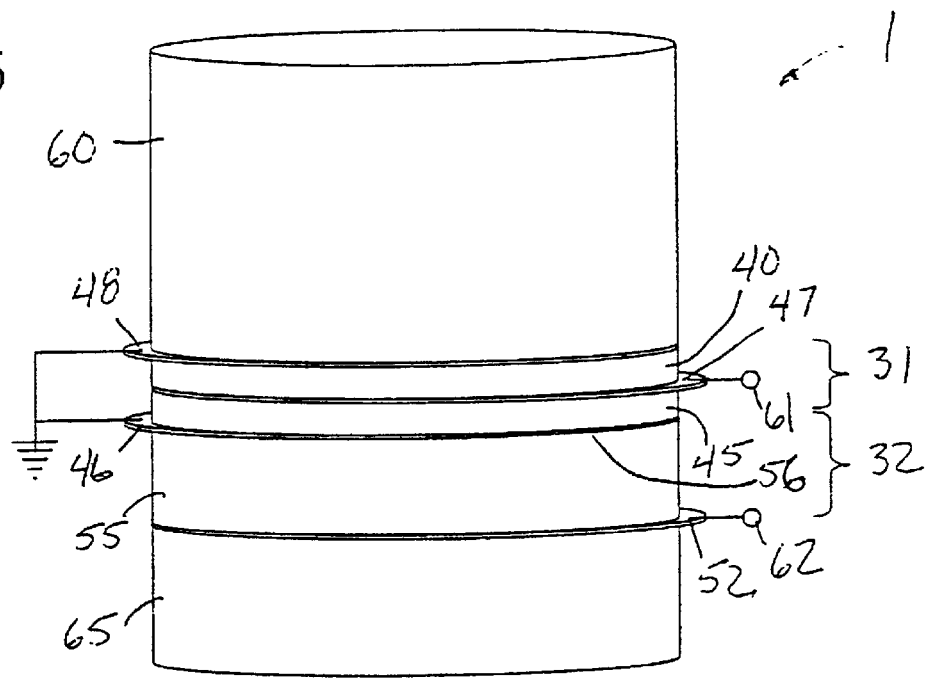
FIG. 5 is a perspective view of one embodiment of a thickness mode vibration piezoelectric transformer of the present invention having a cylindrical configuration.

In the TMPT of FIG. 5, the end-mass tuned TMPT 1 has one input portion 31 and one output portion 32. The input portion 31 of the TMPT 1 comprises two layers 40 and 45 of piezoelectric ceramic separated by an electrical terminal 47. Each of the two input layers 40 and 45 preferably comprises a circular disk of PZT material with electrodes (silver and/or nickel) electro-deposited thereon. The input layers 40 and 45 are polarized in the thickness direction, i.e., in the direction perpendicular to the major faces of the disks. Preferably the direction of polarization of one input layer e.g., 40 is opposite to the direction of polarization of the other input layer e.g., 45.

The two input layers 40 and 45 are each bonded along one of their major faces to a central terminal 47. The central terminal 47 preferably comprises a copper foil. On the remaining major faces of the input layers 40 and 45 are also bonded terminals 46 and 48, also preferably comprising copper foil. Bonding of the input layers 40 and 45 to the terminals 46, 47 and 48 is preferably with "Cibageigy AV118" (CIBA) as manufactured by Ciba Specialty Chemicals Corporation, N.A. of East Lansing, Mich.

The output portion 32 of the TMPT 1 comprises a piezoelectric ceramic layer 55. This output layer 55 also preferably comprises a circular disk of PZT ceramic material polarized in the thickness direction. The output layer 55 is of substantially the same circumference as the input layers 40 and 45, but is significantly thicker than the input layers 40 and 45 in the direction of its polarization. One major face of the output layer 55 is bonded to an outboard terminal 46 of the input portion 31, preferably using CIBA adhesive. To the remaining major face of the output layer 55 may be bonded (preferably using CIBA adhesive) another terminal 52, preferably comprising a copper foil.

On each side of the device of FIG. 5 (to the exterior terminals) is bonded an end-mass 60 and 65 (preferably with CIBA adhesive). The end-masses 60 and 65 are preferably metallic (such as aluminum or steel) and of substantially the same circumference as the input and output layers 40, 45 and 55. Although the end-masses 60 and 65, and the input and output layers 40, 45 and 55 may all be of different circumferences, it is preferred that they are all of the same circumference. This allows the resonant characteristics to be more uniform and predictable as well as minimizes the profile of the device. The thickness of the end-mass is chosen dependent on the type of material used for the end-mass and the resonant characteristics desired from the composite TMPT. In most cases, the preferred end-mass 60 and 65 will be steel, because it is denser than PZT and the profile of a TMPT 1 may be minimized using a denser end-mass 60 and 65. When the material comprising the end-mass 60 and 65 is chosen to be aluminum and the mass of the TMPT 1 is required to remain constant, the thickness of the aluminum cylinder to be bonded to the ceramic layers 40, 45 and 55 is approximately 1.64 times the thickness of the ceramic layer(s) being replaced by the mass. (the ratio of the velocities of the acoustic wave in PZT to aluminum is 82/50 or 1.64). Regardless of the material used for the end-mass, it should be non-electroactive and have a mechanic quality factor ($Q_M$) greater than that of the electroactive layers.

Figure 6:
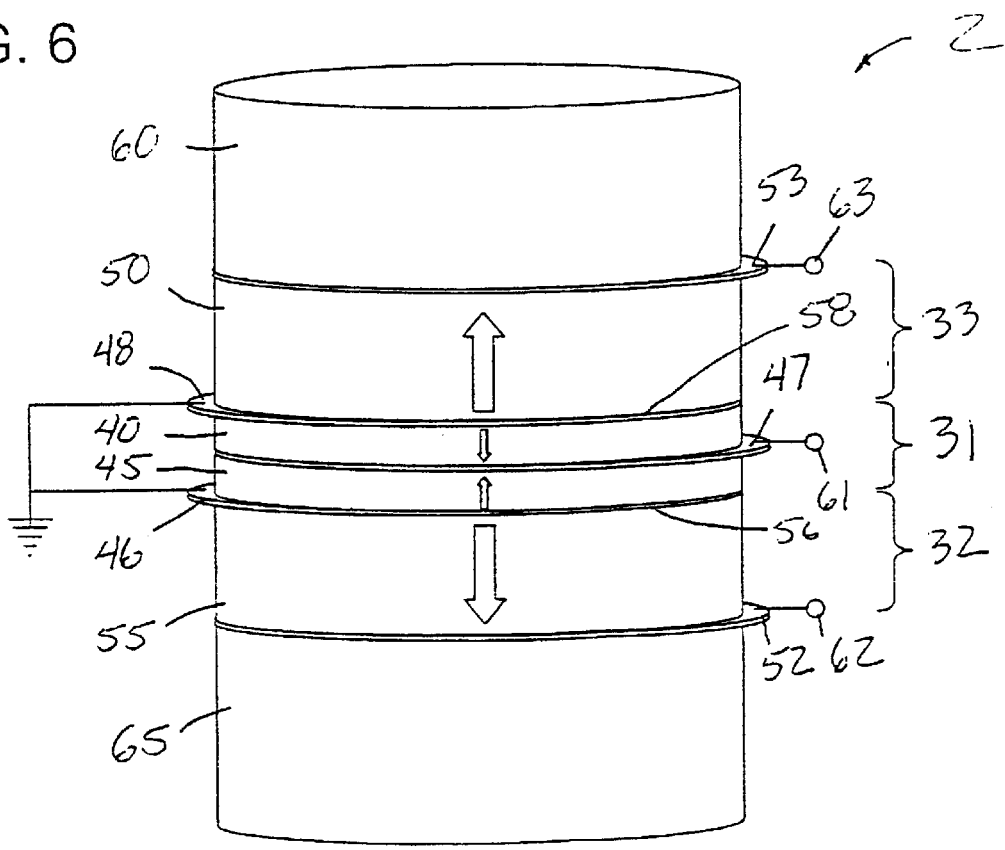
FIG. 6 is a perspective view of another embodiment of a thickness mode piezoelectric transformer of the present invention having a cylindrical configuration.

Now referring to FIG. 6: A TMPT 2 with four ceramic layers may be constructed by bonding a second output portion 33 (preferably with CIBA adhesive) to the input portion 31. The second output portion 33 of the TMPT comprises another piezoelectric ceramic layer 50. This output layer 50 also preferably comprises a circular disk of PZT ceramic material polarized in the thickness direction. The second output layer 50 is of substantially the same circumference as the input layers 40 and 45, but is significantly thicker than the input layers 40 and 45 in the direction of its polarization and is preferably the same thickness as the first output layer 55. Although the end-masses 60 and 65, and the input and output layers 40, 45, 50 and 55 may all be of different circumferences, it is preferred that thy are all of the same circumference. It is also preferred that the input layers 40 and 45 are of substantially equal thickness and that the out put layers 50 and 55 are of substantially equal thickness. This allows the resonant characteristics to be more uniform and predictable as well as minimizes the profile of the device. One major face of the second output layer 50 is bonded to the second outboard, electric terminal 48 of the input portion 31, preferably using CIBA adhesive. To the remaining major face of the second output layer 50 may be bonded (preferably using CIBA adhesive) another terminal 53, preferably comprising a copper foil. The direction of polarization of the output layers 50 and 55 is in the thickness direction, and preferably each output layer 50 and 55 is polarized in the direction away from the center terminal 47 of the input portion 31, i.e., the output layers 50 and 55 are preferably polarized in the thickness direction toward their outboard sides.

The end-masses 60 and 65 that are bonded to the output portions 32 and 33 of the TMPT in FIG. 6 are of substantially the same circumference and thickness. When the end-masses 60 and 65 replace a portion of the output ceramic and the mass of the device is required to remain constant and the end-masses 60 and 65 are chosen to be aluminum, the thickness of the first and second end-mounted masses 60 and 65 are each 1.64 times the thickness of the output ceramic disks that each of the end-masses 60 and 65 replaces. When the end-masses 60 and 65 are chosen to comprise another material, such as steel, the ratio will depend on the physical properties (such as the velocity of the acoustic wave and dimensions) of the material and what total mass or volume device is desired.

As an example of the dimensions of the TMPT of FIG. 5, the input portion 31 of the device comprises two PZT disks 40 and 45 each with a diameter of 0.75 inches and 0.03 inches thick. The output portion 32 comprises a PZT disk 55 with a diameter of 0.75 inches and a thickness of 0.60 inches. Copper foil 46, 47, 48 and 52 is bonded to each major face of the disks 40, 45 and 55 comprising the input and output portions 31 and 32. To the output portion 32 is bonded an aluminum cylinder 65 with a diameter of 0.75 inches and a thickness of 0.656 inches. To the input portion 31 is bonded an aluminum cylinder 60 with a diameter of 0.75 inches and a thickness of 1.542 inches. With an input voltage of 9.5 $V_{rms}$ a composite TMPT 1 constructed to these spedcfications achieved voltage gains as high as 112.9.

As an example of the dimensions of the TMPT of FIG. 6, the input portion 31 of the device comprises two PZT disks 40 and 45 each with a diameter of 0.75 inches and 0.03 inches thick. The output portions 32 and 33 each comprise a PZT disk 50 and 55 with a diameter of 0.75 inches and a thickness of 0.60 inches. Copper foil (3 mils) 46, 47, 48, 52 and 53 is bonded to each major face of the disks 40, 45, 50 and 55 comprising the input and output portions 31, 32 and 33. To each of the output portions 32 and 33 is bonded an aluminum cylinder 60 and 65 with a diameter of 0.75 inches and a thickness of 0.656 inches. The dimensions chosen for the TMPTs 1 and 2 of FIGS. 5 and 6 are only illustrative of the possible configurations for an end-mass-tuned TMPT, and other shapes and thicknesses are both possible and desirable. For example the composite TMPT 1 or 2 need not be cylindrical, and it need not be as thick in height or diameter. It will be understood that since the TMPT is polarized in the thickness direction, that a cross-section (slice) of the cylinder may be taken across its height and the composite TMPT will operate according to the same principles.

Figure 7:
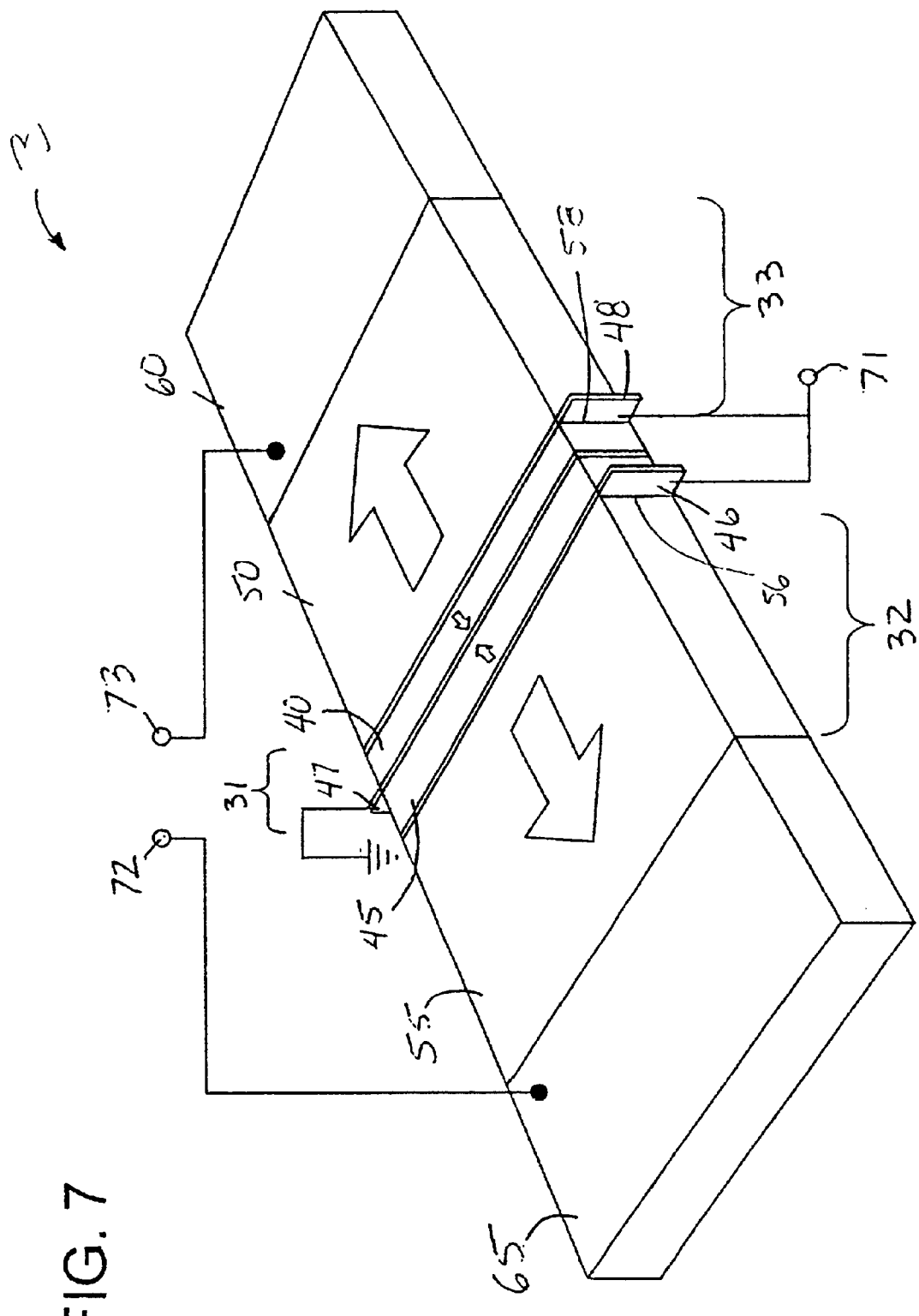
FIG. 7 is a perspective view of another embodiment of a thickness mode piezoelectric transformer of the present invention with a rectangular configuration and showing the electrical connections.

Referring to FIG. 7: A composite TMPT 3 is illustrated which is configured in the shape of a rectangular slab rather than a cylinder. However, (with only slight exceptions) the portions of the TMPT 3 of FIG. 7 remain the same as the TMPT 2 in FIG. 6. In the center of the device is the input portion 31 comprising two layers 40 and 45 of piezoelectric ceramic material (preferably PZT) bonded to a central terminal 47 and two outboard terminals 46 and 48. To the two outboard terminals 46 and 48 of the input portion 31 are bonded two output ceramic layers 50 and 55 (preferably PZT). To the outboard sides of the output ceramic layers 50 and 55 are bonded end-masses 60 and 65. In the case of the TMPT 3 of FIG. 7, the end-masses 60 and 65 comprise a conductive material such as steel, and the need for additional terminals on the outboard sides of the output ceramic layers 50 and 55 is thus obviated.

The ceramic layers 40 and 45 of the input portion 31 are both polarized in the thickness direction and preferably are polarized towards the center electrode 47 as indicated by the arrows. The ceramic layers 50 and 55 of the output portions 32 and 33 are also both polarized in the thickness direction and preferably are polarized away from the center electrode 47 towards the end-mass 60 and 65 on the same side as the respective output portion 32 and 33 as indicated by the arrows.

The embodiment of the TMPT 3 in FIG. 7 depicts a rectangular slab shaped configuration as well the connection for electrical leads in order to achieve a significant voltage gain. In the preferred embodiment of the invention, the center terminal 47 is a ground connection, and the outboard terminals 46 and 48 are both connected to input terminal 71. The output voltage from the TMPT is taken across output terminals 72 and 73 connected to end-masses 65 and 60 respectively. However, if desired the connection of the input, output and ground terminals may vary from those illustrated in FIG. 7.

A rectangular slab shaped TMPT 3 was constructed having an input portion 31 comprising two input PZT ceramic layers 40 and 45 that are 0.39 by 0.10 by 0.030 inches thick with a central terminal 47 and outboard terminals 46 and 48 comprising 3 mil thick copper foil. The output portions 32 and 33 comprises two output PZT ceramic layers 50 and 55 that are 0.39 by 0.10 by 0.40 inches thick bonded to the outboard terminals 46 and 48 of the input portion 31. The end-masses 60 and 65 comprises layers of steel 0.39 by 0.10 by 0.20 inches thick bonded to the outboard sides of the output portions 50 and 55. In the embodiment depicted in FIG. 7 constructed with the dimensions listed hereinabove, the TMPT 3 had a resonant frequency of 53.7 kHz and achieved voltage gains of 19.8. These measurements are only illustrative of the dimensions of one embodiment of the invention, and many other embodiments are possible depending on the size, frequency and gain of the desired application.

In operation, a voltage of a first polarity is applied to input terminal 71 connected to outboard terminals 46 and 48. This voltage causes input ceramic layers 40 and 45 to piezoelectrically contract in the thickness direction (i.e. a d33 mode deformation parallel to the direction of polarization of the layers 40 and 45). When a voltage of an opposite polarity is applied to input terminal 71 connected to outboard terminals 46 and 48, the applied voltage causes input ceramic layers 40 and 45 to piezoelectrically expand in the thickness direction (i.e. also a d33 mode deformation parallel to the direction of polarization of the layers 40 and 45). Thus, by applying an alternating voltage at a given frequency to the input portion 31 of the TMPT 3, the ceramic layers 40 and 45 cyclically expand and contract (a d33 mode thickness vibration) at the frequency of the applied alternating voltage.

Figure 14:
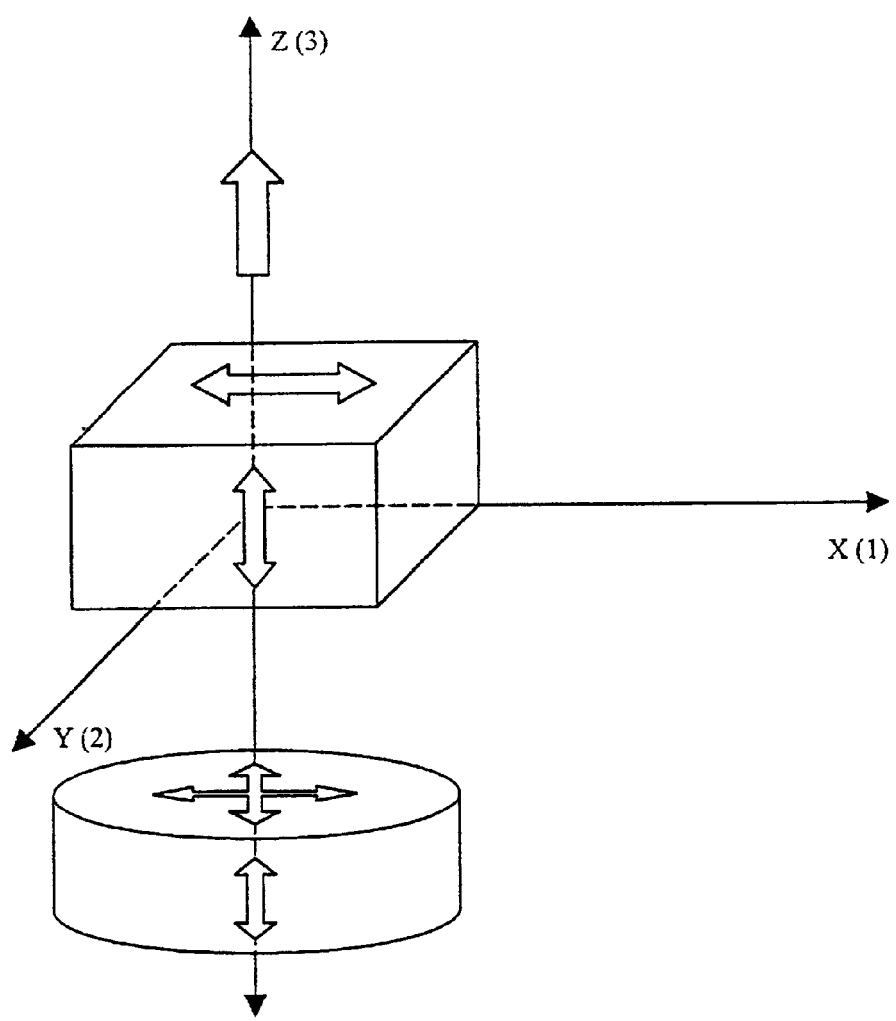
FIG. 14 illustrates the axes along which actuators are poled and deformed.

As the ceramic layers 40 and 45 of the input portion 31 of the TMPT 3 expand, the output portions 32 and 33 travel outwardly from the bond lines 56 and 58 along with the securely bonded input portion 31. Conversely, as the ceramic layers 40 and 45 of the input portion 31 of the TMPT 3 contract, the output portions 32 and 33 travel inwardly from the bond lines 56 and 58 along with the securely bonded input portion 31. When the polarity of the voltage applied to the layers 40 and 45 of the input portion 31 is reversed, the direction of expansion or contraction of the ceramic layers 40 and 45 almost instantaneously reverses. The direction of movement of the output portions 32 and 33 does not change as quickly. Like a mass-spring system, the momentum of the output portions 32 and 33 and end-masses 60 and 65 causes them to continue travelling further in their original direction of movement (thereby causing the ceramic layers 50 and 55 to expand or contract) before changing direction to move in same the direction as the input portion 31. Thus, the movement and changes of direction (vibration) of the input portion 31 causes the output portions 32 and 33 to mechanically strain or deform (due to inertia) in the thickness direction, also vibrating at or near the drive frequency of the voltage applied to the input portion 31. Thus, the d33 mode thickness vibration of the input portion 31 causes a g33 mode thickness vibration in the output portions 32 and 33, and an alternating voltage is piezoelectrically generated across the electrodes 60 and 65 of the output portions 32 and 33. FIG. 14 illustrates the piezoelectric modes where the directions x, y and z correspond to 1, 2 and 3 respectively, and $d_{ab}$ (or $g_{ab}$) correspond to the deformation mode, with a being the poling axis (the poling axis is generally the z(3) axis) and b being the axis along which the piezoelectric body deforms. Thus a $d_{31}$ deformation corresponds to deformation along the x(1) axis in relation to the poling axis z(3). With a circular disk, the d31 deformation corresponds to a radial/planar deformation since the x(1) and y(2) directions are symmetrical.

If the frequency applied to the input portion 31 is chosen to correspond to the natural resonant frequency of the TMPT 3 (in the thickness direction along the length of the TMPT 3), higher deformation in the output of the device and higher gains may be realized. Thus, a TMPT 3 will realize its highest gains operating at resonance. The resonant frequency of the TMPT depends not only on the length of the device (relative to the wavelength of the applied frequency), but also the mass of the device, including the end-masses 60 and 65. The resonant frequency also varies with the length and mass of each individual output layer 50 or 55 and its ratio of length and mass to its respective end-mass 60 or 65. Bonding the end-masses 60 and 65 to the output portions of the TMPT 3 increases the length and the mass of the TMPT 3 and therefore lowers the resonant frequency of the device. The length and mass of the end-masses 60 and 65 can also be chosen to increase the momentum of the output portions 32 and 33 while concentrating the compressive and tensile forces about the bond-lines 56 and 58 between the input portion 31 and output portions 32 and 33. Increasing these compressive and tensile forces also increases the gain realized in the TMPT 3. The increased mass and momentum of the TMPT 3 is accomplished by adding the end-masses 60 and 65 that are denser than the output ceramic and not by adding additional ceramic layers to the device. By eliminating the need for additional output ceramic layers, capacitive and dielectric losses are reduced, and the achievable gain of the device increases. The end-masses 60 and 65 further reduce dissipative losses by allowing the TMPT 3 to operate at a lower frequency which reduces the heat generated by the device (heat which can increase dielectric losses). Furthermore, because the end-masses 60 and 65 are typically chosen to be metallic, the end-masses 60 and 65 act as heat sinks which absorb and dissipate the heat generated in the ceramic layers 50 and 55, and further reduce dielectric losses due to heat.

The TMPTs illustrated in FIGS. 5–7 also provide greater power density, and therefore greater power transmission efficiency than prior devices. The end-masses 60 and 65, typically metal having a high mechanical quality factor, are bonded to the output portions 50 and 55 of a TMPT to augment or replace some or all of the ceramic in the output portions 32 or 33. By increasing the mechanical quality factor of the composite piezoelectric transformer, the gain and power transmission efficiency can become higher. The increase in gain is due to the fact that the additional mass increases the momentum of the device without adding ceramic layers (which adds to capacitive and dielectric losses). The increase in gain using less ceramic layers results in a higher power to volume ratio. Since the preferably metallic end-masses have a higher mechanical quality factor than the ceramic they augment or replace, a higher gain is realized with less ceramic, and the power density of the composite TMPT increases. Furthermore, when the end-masses are chosen to be a material that is denser than the ceramic, a TMPT of a given size may be constructed that has greater mass (than its all ceramic counterpart) and therefore a lower resonant frequency of operation. The greater mass for a given size TMPT also provides greater momentum and therefore generates higher voltage gains as well as increased power handling capacity.

PT Transducer with Resonant Horn

Figure 8:
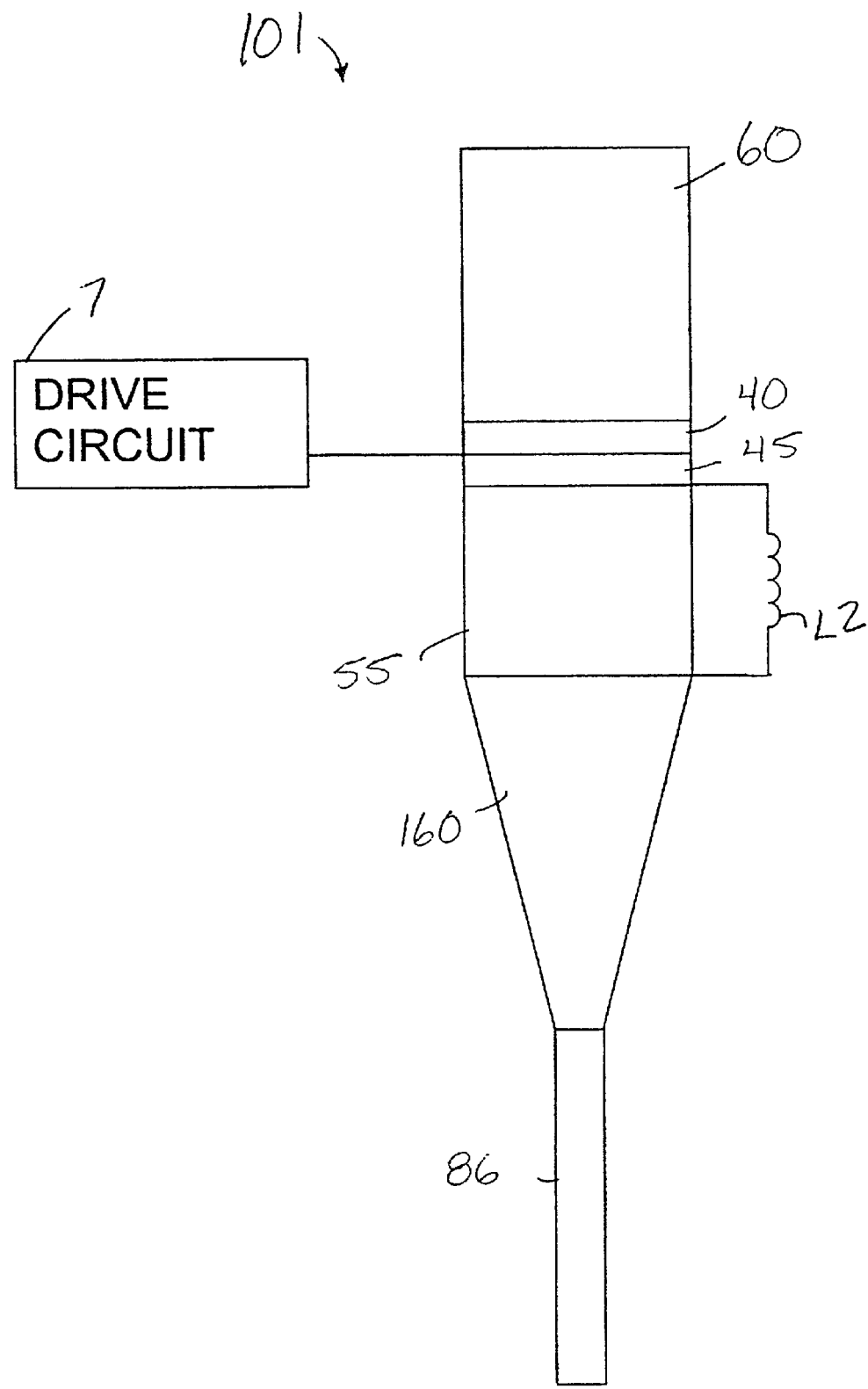
FIG. 8 is a schematic of a TMPT of the type in FIG. 5 using a resonant horn as an end-mass and connected to an actuator drive circuit.

A PT of the type in FIG. 5 exhibits not only electrical energy across the output layer 50, but also exhibits some mechanical vibrational energy. The PT may be modified in order to use the vibrational energy as an actuator. Because the vibrating motion generated by the piezoelectric layers 40, 45 and 55 is typically too low for practical use as a vibrational actuator (maximum peak to peak displacement at the face of the output layer is typically of the order 15–20 microns), it is preferred to magnify or amplify this motion. FIG. 8 shows a transducer 101 using a TMPT of the type in FIG. 5 with the exception that the cylindrical end-mass 65 attached to the output layer 55 has been replaced by a resonant "horn" 160. The attached horn 160 is a resonant element operating in the thickness mode in conjunction with the piezoelectric layers 40, 45 and 55 of the transducer 101.

The material of construction of the acoustic horn 160 preferably has high dynamic fatigue strength and low acoustic loss. In order to minimize attenuation the horn 160 is preferably constructed of a material having a very high mechanical Q, such as on the order of 50,000 or greater. Suitable materials that possess these qualities include titanium alloy, aluminum, aluminum bronze and stainless steel, with titanium alloys being preferred over the others in each of the characteristics. Aluminum alloys tend to be softer than titanium while aluminum bronze and stainless steel tend to have greater acoustical losses. These losses result in lower end amplitudes, e.g. amplitudes reduced by factors of 0.75–0.5, assuming a given power going into the transducer 101. These losses also generate heat that shifts the resonant frequency of the transducer 101.

Referring to FIG. 8: The horn 160 has a proximal end which is coupled to the output layer 55 of the TMPT and a distal end which is the "working end" of the transducer 101. The proximal end of the horn 160 is coupled to the output layer by any suitable means such as clamping, chemical bonding or ultrasonic welding. Preferably the proximal end of the horn 160 is glued to the output layer 55 with an adhesive which produces a strong mechanical bond for best acoustic coupling. Most preferably, bonding of the output layer 55 to the horn 160 is achieved using "Cibageigy AV118" (CIBA) manufactured by Ciba Specialty Chemicals Corporation, N.A. of East Lansing, Mich. The preferred horn designs are shown in FIGS. 11*a*–*f*: These horn designs include the linear tapered horn 160*a*, the exponentially tapered horn 160*b* and the stepped horn 160*c*. Each of these horns has a proximal end which may be coupled to the output layer 55 of the TMPT and a distal end which is the "working end" of the transducer 101. Each of these horns differs in the manner in which it tapers from a larger cross-section at the proximal end to a smaller cross-section at the distal end. Due to their individual designs, each of these horns varies in the degree of simplicity of manufacture, mechanical strength and acoustic gain.

Figure 11A:
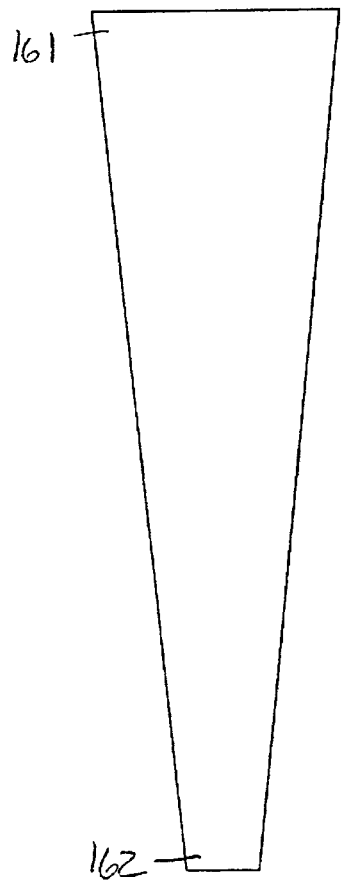
FIGS. 11a–f show an elevation view and a plan view of each of the types of resonant horns which may be used with the PT/actuator.
Figure 11B:
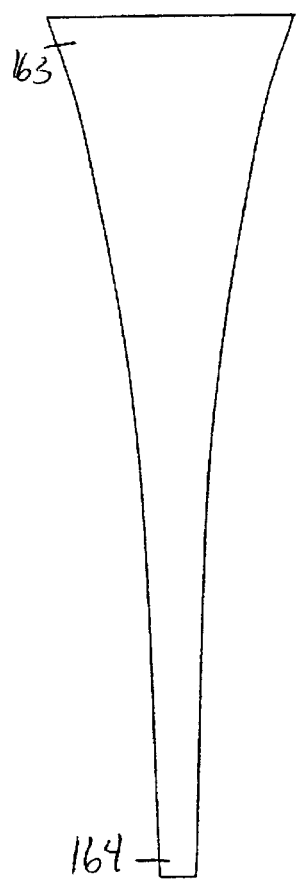
Figure 11C:
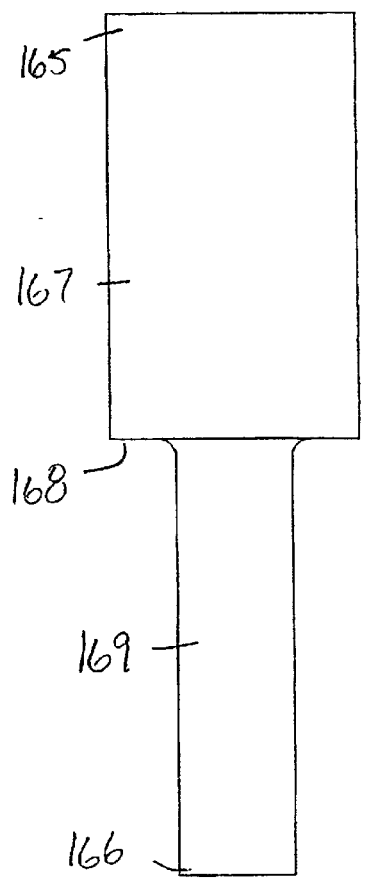
Figure 11D:
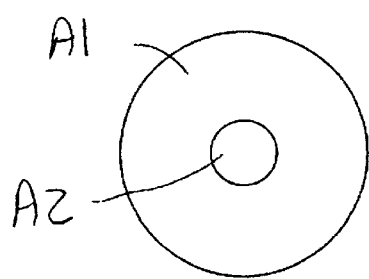

FIGS. 11*a* and 11*d* show an elevation view and a plan view respectively of the linear tapered horn 160*a*. The linear tapered horn 160*a* is a solid horn where the proximal end 161 has a first cross-section A1 which tapers evenly (at a uniform rate) to the smaller cross-section A2 at the distal end 162, i.e., the linear tapered horn 160*a* is essentially a conic section. Preferably, the linear tapered horn 160*a* has a length between its proximal end 161 and distal end 162 substantially equal to a integral multiple of half the applied wavelength (lambda/2), where lambda equals c/f, and f is the frequency of the ultrasonic or vibrational energy supplied to the horn 160*a* and c is the speed of sound in the material. The magnification factor of the linear tapered horn 160*a* is the ratio between the cross-sections or A1/A2. The linear tapered horn 160*a* is simple to manufacture but its achievable magnification is typically limited to a factor of approximately four.

Figure 11E:
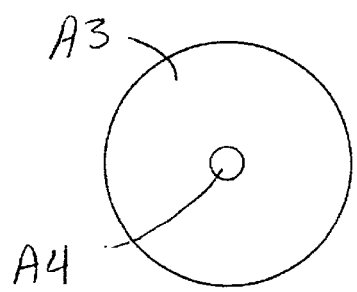

FIGS. 11*b* and 11*e* show an elevation view and a plan view respectively of the exponentially tapered horn 160*b*. The exponentially tapered horn 160*b* is also a solid horn where the proximal end 163 has a first cross-section A3 which tapers along an exponential curve to the smaller cross-section A4 at the distal end 164, i.e., the exponentially tapered horn 160*b* initially tapers quickly from the proximal end 163 and gradually tapers more slowly to the distal end 164. Preferably, the horn 160*b* also has a length between its proximal end 163 and distal end 164 substantially equal to an integral multiple of half the applied wavelength (lambda/2). The magnification factor of the exponentially tapered horn 160*b* is also the ratio between the proximal and distal cross-sections or A3/A4. This design offers higher magnification factors than the linear taper, but its shape makes it more difficult to manufacture. The length of the exponentially tapered horn 160*b* coupled with its small diameter at the working end makes this design particularly suited to micro applications.

Figure 11F:
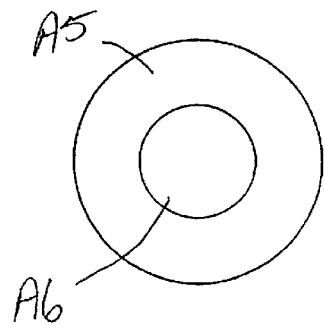

FIGS. 11*c* and 11*f* show an elevation view and a plan view respectively of the stepped horn 160*c*. The stepped horn 160*c* is also a solid horn with the proximal end 165 having a first segment 167 having a first cross-section A5 which decreases in a stepped fashion to the second horn segment 169 having a smaller cross-section A6 at the distal end 166, In other words, the stepped horn 160*c* comprises a first segment 167 having a uniform cross-section A5 (thickness or diameter) for a certain distance from the proximal end 165 up to the step 168 where the cross-section A5 (thickness or diameter) of the segment is abruptly decreased to a smaller cross-section A6 (thickness or diameter) at the second segment 169. The second segment 169 also has a uniform cross-section A6 between the step 168 and the distal end 166. The design of the step 168 of FIG. 11*c* is the preferable design because the first cross-section A5 decreases to the second cross-section A6 with a slight taper that reduces mechanical stress at the step 168 without sacrificing much amplification. Although the step 168 shown in FIG. 11*c* is shown to have a slight taper, having a small radius of curvature as the diameter A5 exponentially tapers at the step 168 to the smaller diameter A6 of the second segment, the radius of the step 168 may be larger, or infinitely small (straight step). In another embodiment of the stepped horn, there may be two or more steps in the stepped horn 160*c*.

The total length of the horn 160*c* is preferably at least one half wavelength and can be designed in multiples of half wavelengths. Preferably the step 168 or steps occur at the antinode(s) of vibration in order to minimize the stress that the horn 160*c* experiences at that point. To this end, each segment 167 and 169 of the stepped horn 160*c* (separated by the step 168) has a length substantially equal to integral multiples of half wavelengths of the frequency of the ultrasonic or vibrational energy supplied to the horn 160*c*. For the stepped horn 160*c*, the amplification factor is given by the square of the ratio of the end areas $(A5/A6)^2$. The potential magnification is limited only by the dynamic tensile strength of the horn material. This is a useful design and easy to manufacture and gains of up to 16-fold are easily achieved using the stepped horn 160*c*.

Figure 12A:
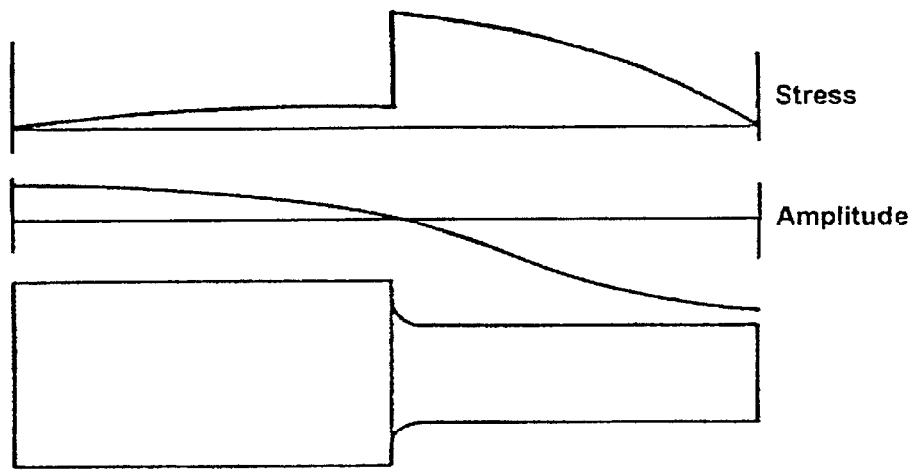
FIGS. 12a–c show graphs of the location and magnitude of displacement and stresses of each of the horns in response to an acoustic input signal at their fundamental resonant frequency ($f_o$)
Figure 12B:
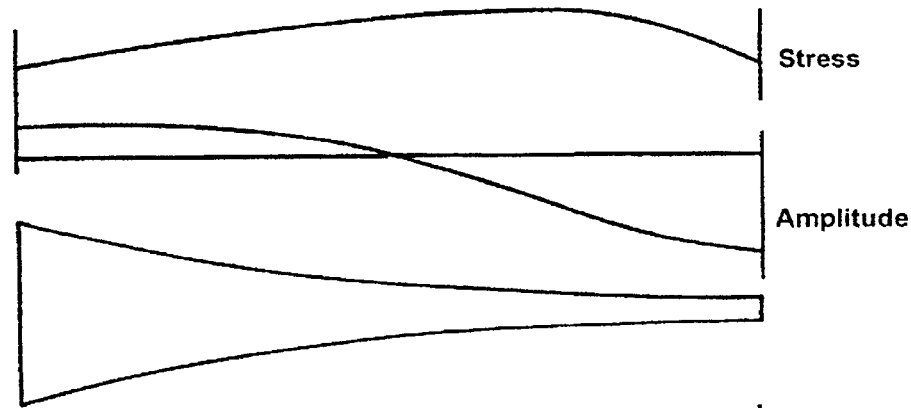
Figure 12C:
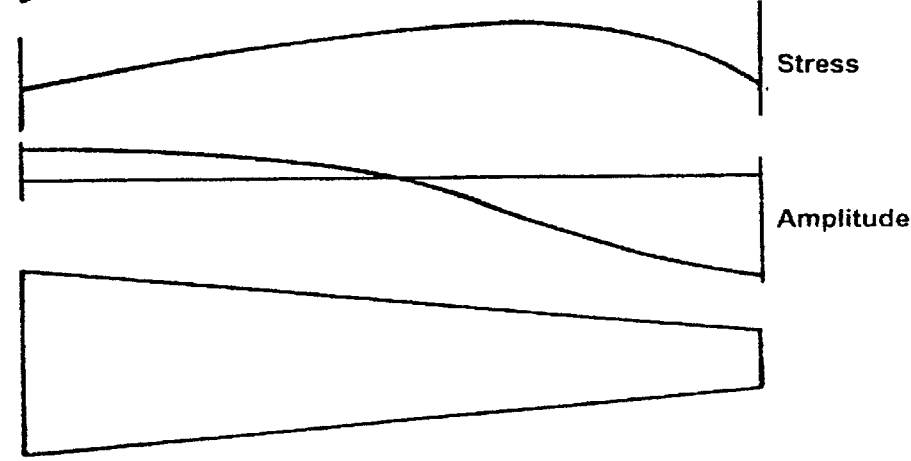

The horn 160 configured as described above amplifies the amplitude of vibrations that are transmitted through the assembly from the proximal to the distal end of the horn 160. As ultrasonic energy is transmitted through the horn 160, the velocity of the acoustic wave transmitted through the horn 160 is amplified. It has been shown that the horn 160 acts as an acoustic displacement transformer analogous to an electrical transformer and functions to increase the displacement produced in response to a given level of input ultrasonic energy. The acoustic power developed will depend upon how heavily the transducer is loaded which is a function of horn magnification. FIGS. 12a–c show the manner in which the displacement varies along the length of horns 160a–c in response to a given input ultrasonic energy level. An actuator 101 constructed in this way can have potential efficiencies of 98% and handle power transfers of the order 500–1000 W when employed in a mode of continuous operation. It should be noted however that if the gain/area product is made too large then either the horn will exceed its dynamic fatigue limits or the electrical control system will be unable to compensate for it and the system will fail to maintain resonance.

Although the distal "working" end of the horn may itself be used to apply vibrational energy directly to a medium, in the preferred embodiment of the invention, the distal end of the horn is adapted to allow fittings (not shown) to be attached to it. The fitting may be attached by any suitable means but preferably the distal end of the horn is internally threaded in order to allow fittings with threaded ends to be securely attached to the distal end of the horn. The attached fittings preferably have a length equal to an integral multiple of half wavelengths of the frequency of vibration of the transducer in order to minimize attenuation of the vibrational energy. For example, the distal end of the horn 160 may be coupled to the proximal end of a transmission rod 86 by an internal threaded connection or by any other suitable-means. The transmission rod 86 may, for example, have a length substantially equal to an integral number of half wavelengths of the frequency of oscillation of the transducer 101. The transmission rod 86 is also preferably fabricated from a solid core shaft constructed out of material that propagates ultrasonic energy efficiently, such as titanium alloy or an aluminum alloy. The transmission rod 86 may alternatively be of a hollow construction. The fitting attached to the horn 160 or transmission rod 86 may further include devices to which one desires to impart vibrational energy. Examples of such devices include one or more blades, tips, picks, brushes, hooks, clamps or a variety of other devices. These devices may be attached to the transducer 101 for example with glue, clamps, screws, threading or with a spring clip.

A desirable objective of transducer assembly 101 is to generate reciprocating movement along the longitudinal axis of the assembly, referred to as longitudinal displacement of the distal end of either the horn or transmission rod. The apparatus has been designed to provide maximum displacement while requiring minimal input energy to achieve that displacement. For example, desirable displacement is on the order of about 20 to 60 microns peak-to-peak, at ultrasonic frequencies. The overall length of the apparatus form the proximal end of horn 160 to the tip disposed at the distal end of the transmission rod 86 generally is in the range of 100 to 150 cm. In other applications, this length may be shorter or greater.

PT Actuator Drive Circuit

Figure 9:
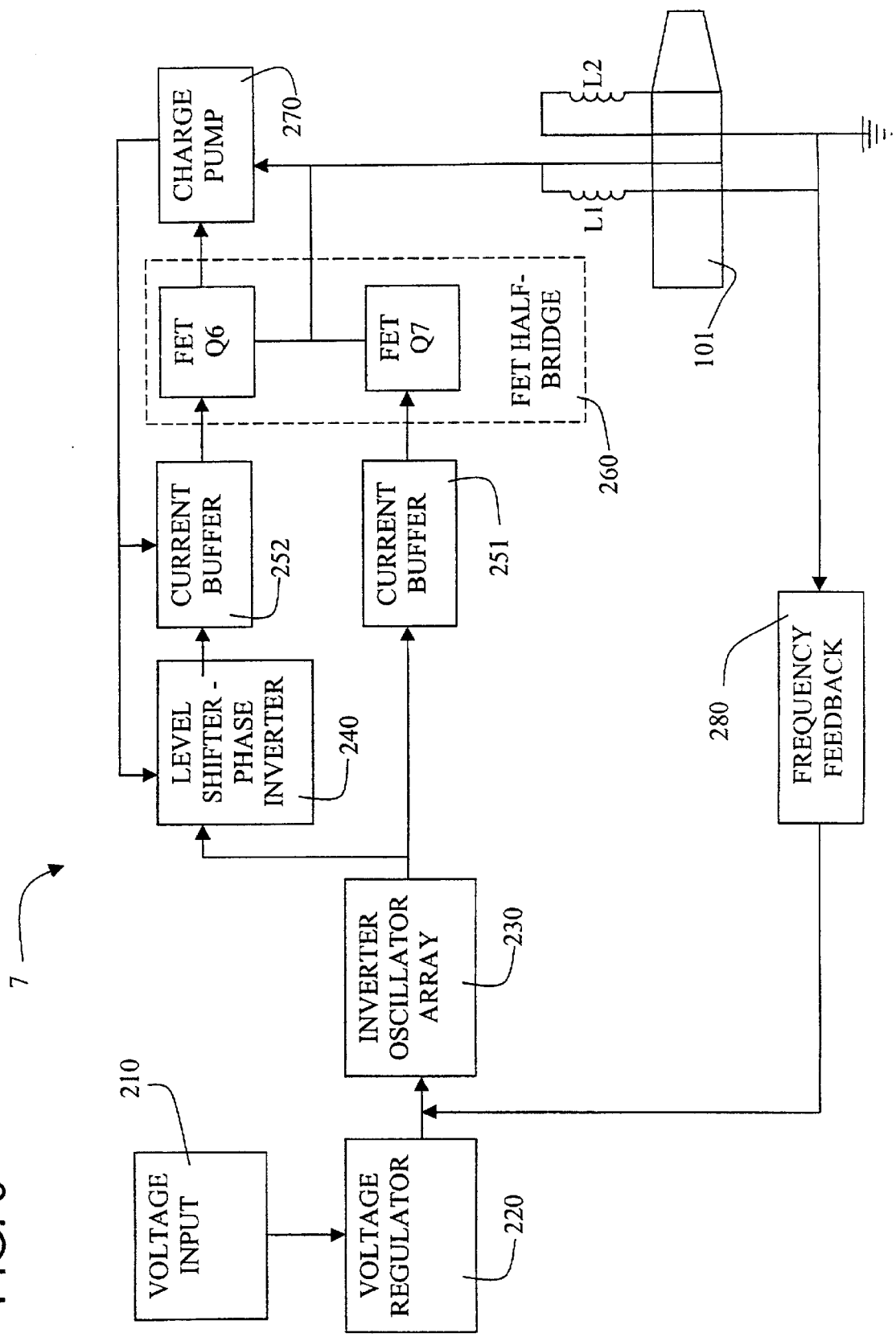
FIG. 9 is a diagram showing the general components of a resonant drive circuit for the PT/actuator.
Figure 10:
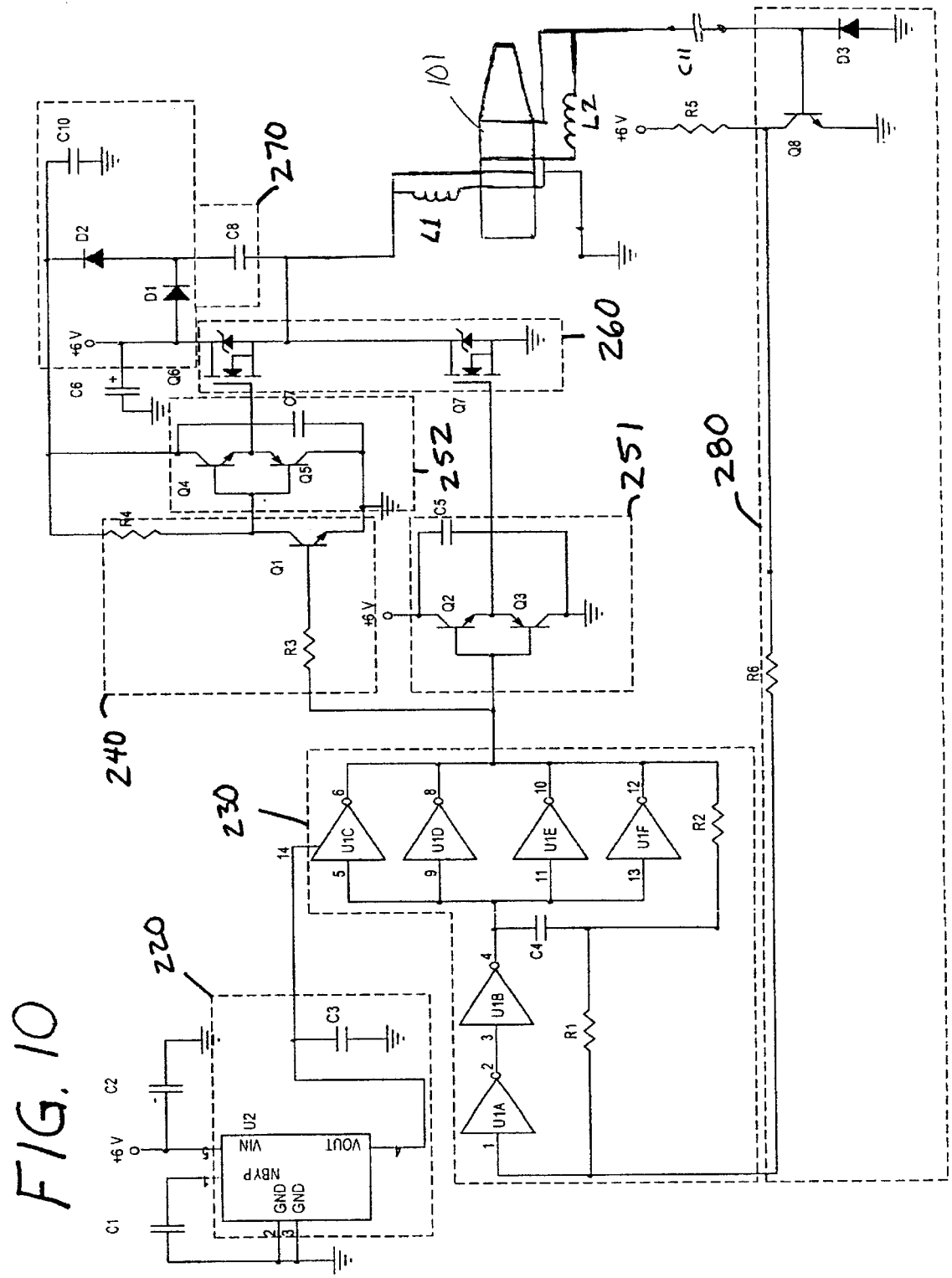
FIG. 10 is a circuit diagram showing the individual components of the circuit of FIG. 9.

Referring now to FIGS. 9 and 10: The input layers 40 and 45 of the TMPT are connected to a resonant drive circuit 7. More specifically, each of the outer terminals 46 and 48 (if present) one the input layers 40 and 45 is connected to ground and the central terminals 47 is connected to the drive circuit 7. Thus, the terminal 46 located between the first input layer 45 and the output layer 55 is ground connected and the terminal 48 between the second input layer 40 and the tail mass 60 is ground connected. Preferably, the tail mass 60 is metallic and thus the second input terminal 40 is not necessary and only the tail mass 60 need be grounded.

An inductor L2 is also connected across the output layer 55. Because the output layer 55 comprises a piezoelectric layer between two terminals 46 and 52, it has a capacitance and thus forms an LC (resonant tank) circuit with the inductor L2. Preferably the value of the inductor L2 is chosen to form a tank circuit having an electrical resonance that substantially matches the mechanical resonance of the PT 5. By matching the electrical resonance to the mechanical resonance, the motion of the output layer 55 is augmented and thus moves further than it would without the inductor L2, thus increasing the motion of the attached horn 160 and attachments.

Referring to FIGS. 9 and 10: The drive circuit 7 preferably comprises a resonant drive circuit connected to the TMPT/actuator 101 at its central terminal 47. The schematic of FIG. 12 is representative of a circuit for driving one of the above described transformers 5 as a vibrational transducer 101. The circuit consists essentially of an inverter-based oscillator 230, which drives two N-channel FETs Q6 and Q7 in a half-bridge 260 configuration. The lower phase FET Q7 is driven through a current buffer 251 and the upper FET Q6 is driven through a level/phase shifter 240 and current buffer 252. The upper FET's Q6 drive circuit is powered by a charge pump 270 that supplies a nominal+12 VDC while the rest of the circuit runs from the+6 VDC supplied externally. The FET half-bridge 260 provides a square-wave drive to the input portion of the PT 5 through an inductor L1 which both provides a voltage gain and results in a quasi-sine-wave at the input of the PT 5. A frequency feedback sub-circuit 280 may also be provided.

Referring now to FIG. 10: In this circuit 7, voltage is applied to the oscillator 230 from a suitable voltage source 210 and a voltage regulator 220. The voltage input 210 ranges, for example, from+6 to 15 volts DC and is input to a voltage regulator chip U2. The output signal of the voltage regulator 220 is an input signal to the oscillator chip U1 of the oscillator section 230. The voltage regulator section 220 comprises not only voltage regulator chip U2, but also-several grounded capacitors C1, C2 and C3 that may be attached as filters on the input and output sides of the voltage regulator chip U2 to provide a stable output signal.

The oscillator section 230 comprises a three stage inverter-based oscillator constructed with a hex CMOS inverter U1. The output stage of the oscillator 230 uses four of the inverters U1C, U1D, U1E and U1F in parallel to reduce loading effects of the circuitry that follows. The input and feedback stages of the oscillator 230 are used to determine the oscillator frequency which is near the natural resonant frequency $f_0$ of the TMPT and comprises in part a series combination of resistor R2 and capacitor C2 connected in parallel with the four inverters U1C, U1D, U1E and U1F. The input and feedback stages of the oscillator 230 also comprise resistor R1, which is connected on one side to the junction of C2 and R2 and the other side to one of the remaining inverters U1A-in the oscillator chip U1, which is connected in series with remaining inverter U1B and the parallel inverters U1C, U1D, U1E and U1F. This provides for the series connected capacitor C4 and resistor R1 connected in parallel with the series connected inverters U1A and U1B, which commute the effect of the RC time constant established by R2 and C4 to the parallel inverters U1C, U1D, U1E and U1F. Thus, when the feedback capacitor C4 is fully charged, the voltage then follows resistor R1, which is input to inverters U1A and U1B. The output of the series connected inverters U1A and U1B completes the feedback path and provides a faster, cleaner switching signal to the input side of the four parallel inverters U1C, U1D, U1E, and U1F. To determine or adjust the initial oscillator frequency, a potentiometer may be used in place of the resistor R2, which may then be replaced with fixed resistor R2 after the circuit is adjusted to the open circuit resonant frequency of the PT 5. The output of the oscillator section 230 is a square wave oscillating between ground and the positive voltage output of the regulator 220.

Figure 13:
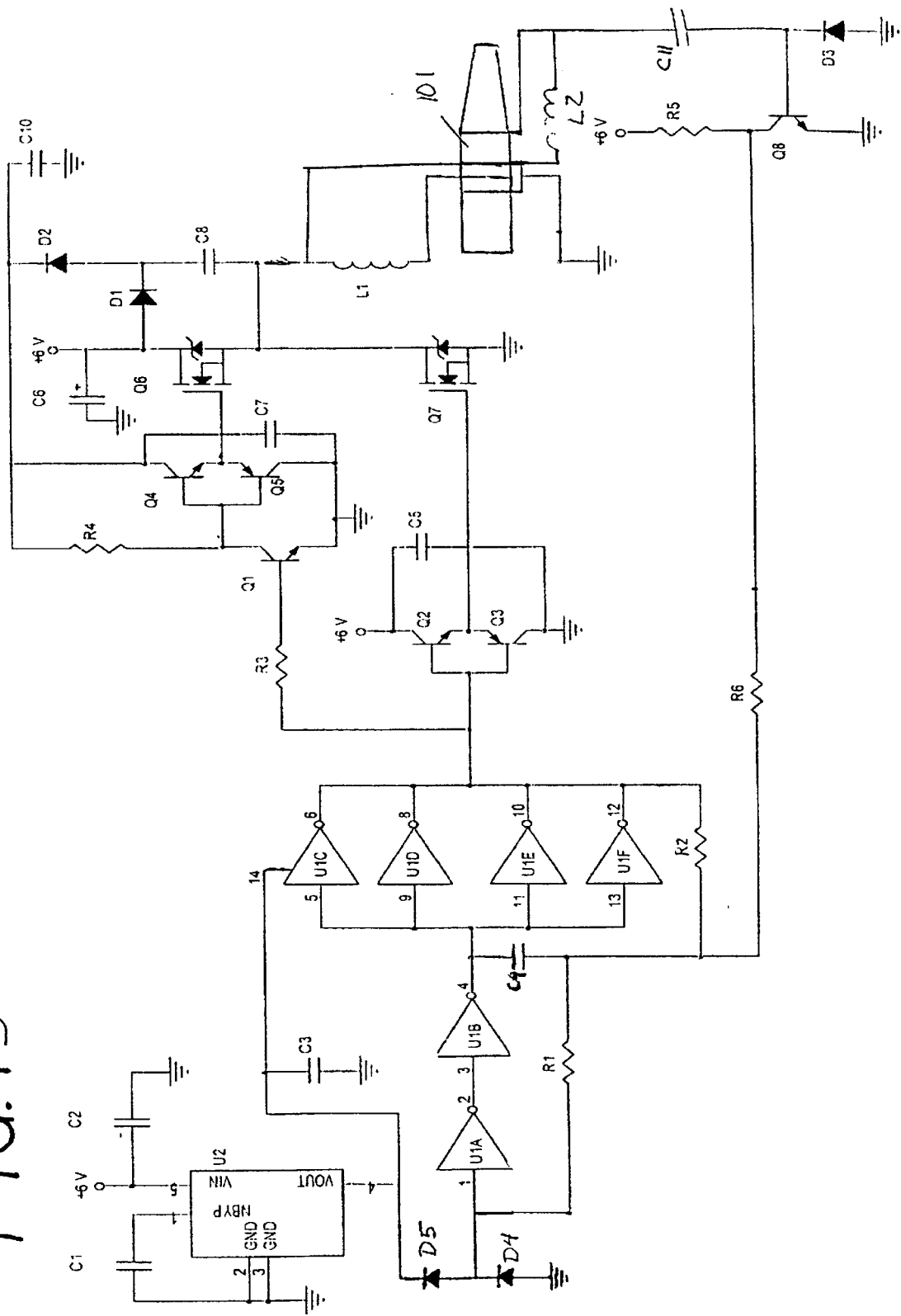
FIG. 13 shows a circuit diagram for an alternate embodiment of the circuit in FIG. 9.

Referring to FIG. 13: Optionally, diodes D4 and D5 may also be attached to the input side of the oscillator section 230 at the input inverter U1A, to provide for transient voltage protection. More specifically, a diode D4 having a grounded cathode and having its anode series connected to the cathode of a second diode D5 which has its anode connected to the voltage regulator 220 output. The junction of the two diodes D4 and D5 is connected to the input of the first inverter U1A. High negative voltages are grounded through diode D4 and high positive voltages are routed through diode D5 to the output of the regulator U2, and filtered by capacitor C3 before being input to the inverter array U1. This prevents high transient voltages from damaging the inverters of the array.

Referring again to FIG. 10: The output of the oscillator 230 is connected (through current buffers 251 and 252 and a level/phase shifter 240) to a half-bridge section 260 comprising two series connected FETs Q6 and Q7. More specifically, the half-bridge section 260 preferably comprises two, stacked N-channel FETs Q6 and Q7. In this configuration the drain of one FET (the lower FET) Q7 is connected to source the of the other FET (the upper FET) Q6. The source of the lower FET Q7 is ground referenced and the drain of the upper FET Q6 has a positive voltage bias (preferably+6–15 volts) and is also connected the charge pump section 270. The upper half of the bridge 260 is driven out of phase with the lower half of the bridge 260 such that when the upper FET Q6 is on, the lower FET Q7 is off, and conversely, when the upper FET Q6 is off, the lower FET Q7 is on. The half-bridge 260 is driven by the oscillator 230 at approximately 50% duty cycle. Driven in this manner, the output of the half-bridge section 260 taken at the drain-source junction of the lower and upper FETs Q7 and Q6 consists of a square wave voltage, going from 0 to+6–15 VDC.

As mentioned above, the half bridge section 260 is driven through dual current buffers 251 and 252 and a level/phase shifter 240. The current buffer sections 251 and 252 provide for fast transitions while switching. The gate of the lower FET Q7 is connected to a first current buffer section 251 and the gate of the upper FET Q6 is connected to a second current buffer section 252 preceded by a level/phase shifter section 240. The current buffers 251 and 252 are provided by two, stacked bipolar transistors (BJTs) operated as emitter followers. More specifically, the first current buffer section 251 comprises two BJTs Q2 and Q3 in a parallel configuration, i.e., having their respective bases and emitters electrically connected to each other. Also, the first BJT's Q2 collector is positively biased with a+6–15 VDC and is connected through capacitor C5 to the second BJT's Q3 collector which is ground referenced. The junction of the BJTs' Q2 and Q3 emitters is electrically connected to the gate of the lower FET Q7 in the half-bridge section 260.

The second current buffer section 252 also comprises two BJTs Q4 and Q5 in a parallel configuration, i.e., having their respective bases and emitters electrically connected to each other. Likewise, the first BJT's Q4 collector is positively biased with a+6–15 VDC and is connected through a capacitor C7 to the second BJT's Q5 collector, which is connected to ground. The junction of the BJTs' Q4 and Q5 emitters is electrically connected to the gate of the upper FET Q6 in the half-bridge section.

The operation of the current buffer sections 251 or 252 is as follows: The output signal of the oscillator section 230 is a square wave oscillating between ground and a positive voltage. When the positive voltage is applied for example, to the bases of the BJTs Q2 and 03 of the lower current buffer 251, the base of BJT Q2 conducts. When the base of BJT Q2 is conducting, capacitor C5 discharges through the collector to the emitter of the BJT Q2, quickly energizing the gate of the lower FET Q7 of the half-bridge section 260. When the ground signal is applied to the bases of the BJTs Q2 and Q3 of the lower current buffer 251, the base of BJT Q3 conducts. When the base of BJT Q3 is conducting, the gate of the lower FET Q7 of the half-bridge section is connected to ground through the collector and the emitter of the BJT Q3 which quickly de-energizes the gate of the lower FET Q7 of the half-bridge section 260. The upper current buffer 252 components (Q4, Q5 and C7) work in conjunction with the upper FET Q6 of the half-bridge section 260 in a similar manner to but out of phase with the lower current buffer 251. This is because additional components (the level/phase shifter 240 and charge pump 270, discussed later) allow the upper current buffer 252 to drive the upper FET Q6 out of phase with the lower FET 7. The current buffer sections 251 and 252 configured in such a manner provide for fast transitions while switching.

As mentioned above, the second current buffer 252 is preceded by a level/phase shifter section 240. The level/phase shifter section 240 consists of two resistors R3 and R4 and a BJT Q1. The BJT Q1 is driven in a common emitter (open collector) mode as a saturated inverting switch. This inversion is needed to drive the upper half of the bridge 260 out of phase with the lower half of the bridge 260. The base of the BJT Q1 is connected to the oscillator 220 output through the first resistor R3 and the collector of the BJT Q1 is connected to the charge pump section 270 through the second resistor R4. The emitter of the BJT Q1 is connected to ground. The first resistor R3 limits the current into the base of the BJT Q1 and reduces the load effects on the oscillator 230. The second resistor R4 pulls up the collector to+12 VDC when the BJT Q1 is not conducting. This gives a gate to source voltage of about six volts to turn on the upper half of the bridge 260. Thus, when the output of the oscillator array 230 is a positive voltage, the BJT Q1 of level/phase shifter 240 conducts to ground, pulling open the gate of BJT Q5 of the second current buffer 252 which connects the gate of the upper FET Q6 of the half bridge 260 to ground. This quickly de-energizes the gate of the upper FET Q6, while the gate of the lower FET 07 is energized. Conversely, when the output of the oscillator array 230 goes to ground, the BJT Q1 of level/phase shifter 240 does not conduct and the second resistor R4 of the level/phase shifter 240 pulls up the collector to+12 VDC. This provides a gate to source voltage through BJT Q4 of the upper current buffer 252 of about six volts to turn on the upper FET Q6 of the bridge 260. This quickly energizes the gate of the upper FET Q6, while the gate of the lower FET Q7 is de-energized.

The+12 VDC provided to the level/phase shifter 240 and upper current buffer 252 is provided through a charge pump section 270. The charge pump section 270 consists of two diodes D1 and D2, and two capacitors C8 and C10. More specifically, a first diode D1 and a first capacitor C8 are connected in a series-parallel combination with the upper FET Q6 of the half-bridge 260, with the first diode D1 input being connected to the upper FET's Q6 drain and the first capacitor being connected to the source of the upper FET Q6, i.e., the output of the half-bridge 260. The drain of the upper FET Q6 is positively biased with+6–15 VDC. A second diode D2 is connected to the junction of the first diode D1 output and the first capacitor C8. The output side of the second diode D2 is connected to a grounded capacitor C10 as well as to resistor R4 of the level/phase shifter 240 and the collector of BJT Q4 of the second current buffer 252. The output of the half-bridge 260 at the junction with capacitor C8 is cyclically forced from+6–15 VDC to 0 VDC and back to+6–15 VDC. Each cycle that lower FET Q7 is on the junction is at 0 VDC and the capacitor C8 is charged to, for example+6 VDC through diode D1. Then when upper FET Q6 is on, the junction is forced to+6 VDC which adds to the voltage already stored in capacitor C8 to charge capacitor C10 to+12 VDC through D2. This+12 VDC on C10 is used by BJT Q1 of the level/phase shifter 240 and BJT Q4 of the current buffer 252.

The square-wave output of the half-bridge section 260 is used to drive an inductor TMPT combination. The inductor is connected across one of the input layers 40. More specifically, the inductor L1 is connected on one end to the input of the TMPT at the center terminal 47, and on the other end to the outer terminal 46 adjacent the tail mass of the TMPT. The other inputs of the TMPT, i.e., the outer terminals 46 and 48 are also connected to ground. The output of the half-bridge 260 is connected to the input portion of the TMPT, and may be connected either side of the inductor L1, i.e., between the inductor L1 and the central terminal 47 or between the inductor L1 and the outer terminal 46. The combination of the inductor's L1 inductance and the capacitance of the TMPT forms a series resonant circuit that preferably has the same resonant frequency as the mechanical resonant frequency of the TMPT. This results in a quasi-sine-wave at the input of the TMPT, which results in higher efficiency operation of the TMPT while achieving voltage gain at the input of the TMPT as well.

Because of the very narrow operating frequency band of the transducer, it is preferable to track changes in resonant frequency of the system. This is very important because the resonant frequency of the transducer decreases as it becomes warm and lengthens. These effects are sufficient to shift the system off resonance with an accompanying performance loss were it not for the automatic tracking, normally referred to as automatic frequency control (AFC). Thus it is preferred that the electrical signal be fed back into the driver circuit to enable the frequency of the driver circuit to follow any frequency changes in the transducer system.

Current sensing for frequency control may be provided at the high voltage end of the output layer 55 which is grounded via capacitor C11 through the parallel connection of a feedback transistor Q8 and diode D3. The capacitor C11 is preferably approximately 0.5 picofarad and 3000 volt capacitor C11 connected on one end to the high voltage output portion of the transducer, and on the other end to the cathode of the anode grounded diode D3, and to the gate of the transistor Q8. The transistor Q8 is configured in a common emitter open collector configuration that is turned on and off each cycle. The resulting square-wave output of the transistor Q8 is phase shifted and modified by a resistor R6. This waveform is summed with the feedback in the oscillator at the junction of R1 and U1A, as in FIG. 13, or alternatively at the junction of C4 and R2, as in FIG. 14. This results in the inverter oscillations being synchronized to the natural resonant frequency of the PT 5, which compensates for variations due to the temperature or the load and relaxes tolerance requirements for reduced circuit cost.

While the above description contains many specificities, these should not be construed as limitations on the scope of the invention, but rather as an exemplification of one preferred embodiment thereof. Many other variations are possible, for example:

While in the preferred embodiment of the invention the ceramic layers are preferably constructed of a PZT ceramic material, the layers may be other piezoelectric, ferroelectric or other electroactive elements;

While the input portion preferably comprises two relatively thin layers of ceramic, the input portion may comprise as few as one electroactive layer or may be of a multi-layer construction;

The shape of the TMPT need not be cylindrical or slab shaped, and many other shapes or configurations are possible;

The direction of polarization of the input layers need not be toward the central electrode, but may be away from the central electrode or both layers may be polarized in the same direction;

The direction of polarization of the output layer(s) need not be away from the central electrode, but may be toward the central electrode or both layers may be polarized in the same direction;

The material of construction of the end-mass or horn need not be titanium, aluminum or steel, but may be a different metal, or even a non-metallic material having good acoustic transmission;

A variety of fittings may be attached to the horn for application of vibrational energy for a wide variety of purposes.

Accordingly, the scope of the invention should be determined not by the embodiment illustrated, but by the appended claims and their legal equivalents.

I claim:

1. A vibratonal transducer, comprising:
   a first input electroactive layer having first and second opposing electroded major faces and polarized in a direction parallel to an axis normal to said first and second opposing major faces;
   a second input electroactive layer having first and second opposing electroded major faces and polarized in a direction parallel to said axis;
   a first input terminal adjacent said first electroded major of said first input electroactive layer and said first electroded major face of said second input electroactive layer;
   an output electroactive layer having first and second opposing electroded major faces and polarize in a direction parallel to said axis;
   a second terminal adjacent said second electroded major face of said second input electroactive layer and said first electroded major face of said output electroactive layer;
   a rigid end-mass adjacent said second electroded major face of said first input electroactive layer;
      said rigid end-mass comprising a non-electroactive material having mechanical quality factor that is higher than a mechanical quality factor of said first input electroactive layer;
   a vibratonal amplifier having a proximal end and a distal end;
      said vibrational amplifier tapering from a first cross-section at said proximal end to a second smaller cross-section at said distal end;
      said proximal end of said vibrational amplifier being adjacent said second electroded major face of said output electroactive layer;

a first inductor having a first end an a second end;
   said first end of said first inductor being connected to said second terminal;
   said second end of said first inductor being connected to said second electroded major face of said output electrically layer; and
a resonant drive circuit electrically connected to said first input terminal, said resonant drive circuit comprising:
   a second inductor having a first end and a second end;
      said first end of said second inductor being electrically connected to said first input terminal;
      said second end of said second inductor being electrically connected to said second electroded major face of said first input electroactive layer;
   a power source;
   an oscillator array having an input side and an output side;
      said power source being connected to said input side of said oscillator array;
   a first current buffer having an input side and an output side;
      said input side of said fist current buffer being connected to said output side of said oscillator array;
   a level/phase shifter having an input side and an output side;
      said input side of said level/phase shifter being connected to said output side of said oscillator array in parallel with said first current buffer;
   a second current buffer having an input side and an output side;
      said input side of said second current buffer being connected in series with said output side of said level/phase shifter; and
   a FET half-bridge comprising a first FET and a second FET;
      a drain of said first FET being connected by an output conductor of said FET half-bridge to a source of said second FET;
      a gate of said first FET being connected to said output side of said first current buffer;
      a gate of said second FET being connected to said output side of said second current buffer;
      said output conductor of said FET half-bridge being connected to said first input terminal.

2. The vibrational transducer according to claim 1, further comprising:
   an dielectric layer having first and second opposing major faces;
      said first major face of said dielectric layer being bonded to said second terminal;
   an output terminal adjacent said first electroded major face of said output electroactive layer and said second major face of said dielectric layer; and
   a charge pump having an input side and an output side;
      said input side of said charge pump being connected to said output conductor of said FET half-bridge;
      said input side of said charge pump being connected to a drain of said second FET in said half-bridge;
      said output side of said charge pump being connected to said level/phase shifter;
      said output side of said die pump being connected to said second current buffer;
   wherein said rigid end-mass comprises an electrically conductive material in contact with said second face of said output electroactive layer;
   and wherein said first and second input electroactive layers and said output electroactive layer are of substantially the same cross section;
   and wherein said first input electroactive layer and said second input electroactive layer are polarized in opposite directions parallel to said axis.

3. The vibrational transducer according to claim 2,
   wherein said oscillator array comprises an inverter array;
   and wherein an output signal of said oscillator array comprises an electrical signal oscillating between a ground value and a positive value.

4. The vibrational transducer according to claim 3,
   wherein said oscillator array further comprises:
   a first resistor in series with a first capacitor, said first resistor and said first capacitor being connected in parallel with a first inverter of said inverter array.

5. The vibrational transducer according to claim 4,
   wherein said oscillator array further comprises:
   a second inverter of said inverter array connected in series with said first inverter; and
   a second resistor connected in series with said first capacitor;
      said second resistor and said first capacitor being connected in parallel with said second inverter.

6. The vibrational transducer according to claim 5,
   wherein said level/phase shift r further comprises:
   a first transistor;
      said first transistor being a PNP type BJT having a collector connected to said input side of said second current buffer;
      said first transistor having an emitter connected to ground;
   a third resistor connected in series between said output side of said oscillator array and a base of said first transistor; and
   a fourth resistor connected in series between said output side of said charge pump and said collector of said first transistor.

7. The vibrational transducer according to claim 6,
   wherein said first current buffer further comprises:
   a second capacitor having first and second sides;
   a second positive voltage source;
   a second transistor;
      said second transistor being a NPN type BJT having a base connected to said output side of said oscillator array;
      said second transistor having a collector connected to said first side of said second capacitor;
      said second transistor having said collector connected to said second positive voltage source; and
   a third transistor;
      said third transistor being a PNP type BJT having a base connected to said output side of said oscillator array;
      said third transistor having a collector connected to said second side of said second capacitor;
      said third transistor having said collector connected to ground;
      said output side of said first current buffer being at a junction of an emitter of said third transistor with an emitter of said second transistor.

8. The vibrational transducer according to claim 7,
   wherein said second current buffer further comprises:
   a third capacitor having first and second sides;
   a fourth transistor;

said fourth transistor being a NPN type BJT having a base connected to said collector of said first transistor;
said fourth transistor having a collector connected to said first side of said third capacitor;
said fourth transistor having said collector connected to said output side of said charge pump; and a fifth transistor;
said fifth transistor being a PNP type BJT having a base connected to said collector of said first transistor;
said fifth transistor having a collector connected to said second side of said third capacitor;
said fifth transistor having said collector connected to ground;
said output side of said second current buffer being at a junction of an emitter of said fifth transistor and an emitter of said fourth transistor.

9. The vibrational transducer according to claim 8, wherein said charge pump further comprises:

a first diode having a cathode connected to a drain of said second FET in said half-bridge;
a third positive voltage source connected to said drain of said second FET in said half-bridge;
a fourth grounded capacitor having an ungrounded side connected to said fourth resistor and to said collector of said fourth transistor;
a second diode having an anode connected to said ungrounded side of said fourth capacitor and having a cathode connected to an anode of said first diode; and
a fifth capacitor having a first side and a second side;
said first side of said fifth capacitor being connected to said output side of said half-bridge and to said input side of said inductor;
said second side of said fifth capacitor being connected to said cathode of said second diode.

10. The vibratonal transducer according to claim 9, further comprising:

a feedback subcircuit connected between said output electroactive layer of said vibrational transducer and said input side of said oscillator array.

11. The vibrational transducer according to claim 10, wherein said feedback subcircuit comprises:

a third diode having a grounded cathode and having an anode connected an electroded major face of said output electroactive layer;
a sixth transistor having a base connected to said anode of said third diode and to an electroded major face of said output electroactive layer;
a positive voltage source connected to a collector of said sixth transistor; and
a fifth resistor having first and second sides;
said first side of said fifth resistor being connected to said collector of said sixth transistor;
said second side of said fifth resistor being connected to said input side of said oscillator array.

12. The vibrational transducer according to claim 11, wherein said oscillator array further comprises a third inverter of said inverter array connected in parallel with said first inverter.

13. The vibrational transducer according to claim 12, wherein said oscillator array further comprises a fourth inverter of said inverter array connected in series between said second inverter and said first and third parallel inverters.

14. The vibrational transducer according to claim 13, wherein said second side of said fifth resistor is connected to said input side of said oscillator array between said second resistor and said second inverter.

15. The vibrational transducer according to claim 14, wherein said second side of said fifth resistor is connected to said input side of said oscillator array between said first resistor and said first capacitor.

* * * * *